United States Patent [19]
Anderson et al.

[11] Patent Number: 5,913,926
[45] Date of Patent: Jun. 22, 1999

[54] EXPANDABLE MODULAR DATA STORAGE SYSTEM HAVING PARITY STORAGE CAPABILITY

[75] Inventors: Michael Anderson, Westlake Village; Donald E. Shewmon, Thousand Oaks; Michael L. Steen, Newbury Park; Martin Smith, Camarillo, all of Calif.

[73] Assignee: Farrington Investments Ltd., Grand Cayman Islands, Cayman Islands

[21] Appl. No.: 08/966,773

[22] Filed: Nov. 7, 1997

Related U.S. Application Data

[63] Continuation of application No. 08/592,115, Jan. 26, 1996, abandoned, which is a continuation-in-part of application No. 08/562,559, Nov. 20, 1995, Pat. No. 5,604,662, which is a continuation of application No. 08/345,492, Nov. 28, 1994, abandoned, which is a continuation of application No. 07/932,794, Aug. 20, 1992, abandoned, and a continuation of application No. 08/027,668, Mar. 8, 1993, abandoned.

[51] Int. Cl.⁶ .................. G06F 1/16; H05K 7/10
[52] U.S. Cl. .................. 714/6; 395/182.05; 361/600; 361/685; 360/98.01
[58] Field of Search .................. 395/182.04, 182.05, 395/441, 439; 361/600, 679, 685; 360/98.01, 900, 903

[56] References Cited

U.S. PATENT DOCUMENTS

| | | | |
|---|---|---|---|
| T932,005 | 3/1975 | Kurskal | 235/153 |
| 3,120,412 | 2/1964 | Caldwell | |
| 3,623,014 | 11/1971 | Doetz et al. | 340/172.5 |
| 4,338,642 | 7/1982 | Clark et al. | 360/97 |
| 4,558,914 | 12/1985 | Prager et al. | 339/75 |
| 4,598,357 | 7/1986 | Swenson et al. | 364/200 |
| 4,608,688 | 8/1986 | Hansen et al. | 371/11 |
| 4,648,059 | 3/1987 | Gregorcyk | 364/769 |
| 4,722,085 | 1/1988 | Flora et al. | 371/38 |
| 4,733,396 | 3/1988 | Baldwin et al. | 371/38 |
| 4,761,785 | 8/1988 | Clark et al. | 371/51 |
| 4,833,554 | 5/1989 | Dalziel et al. | 360/98.04 |
| 4,853,807 | 8/1989 | Trager | 360/97.01 |
| 4,858,070 | 8/1989 | Buron | 361/384 |
| 4,870,643 | 9/1989 | Bultman et al. | 371/11.1 |
| 4,898,550 | 2/1990 | Ayer | 439/718 |
| 4,941,841 | 7/1990 | Darden et al. | 439/377 |
| 4,996,628 | 2/1991 | Harvey et al. | 361/393 |
| 5,037,319 | 8/1991 | Hatagishi | 439/140 |
| 5,056,073 | 10/1991 | Fitzgerald et al. | 369/36 |
| 5,123,000 | 6/1992 | Fitzgerald et al. | 369/36 |
| 5,124,886 | 6/1992 | Golobay | 361/391 |
| 5,156,556 | 10/1992 | Ma | 439/357 |
| 5,235,493 | 8/1993 | Yu | 361/685 |
| 5,253,133 | 10/1993 | Guo | 360/97.01 |
| 5,515,239 | 5/1996 | Kamerman et al. | 361/727 |
| 5,604,662 | 2/1997 | Anderson et al. | 361/685 |

*Primary Examiner*—Ly V. Hua
*Attorney, Agent, or Firm*—Oppenheimer Wolff & Donnelly LLP

[57] ABSTRACT

An expandable modular data storage array for storing and backing up data transmitted from a host computer including a plurality of data storage devices, a plurality of substantially identical, vertically stacked storage device housings adapted to slidably receive a data storage device, and mechanical connection elements for releasably connecting the top of one storage device housing to the bottom of a storage device housing stacked thereon. The array is connectable to a host computer and receives data and corresponding parity data therefrom. The parity data are indicative of data intended to be stored, from which parity data the intended data are reconstructable.

24 Claims, 12 Drawing Sheets

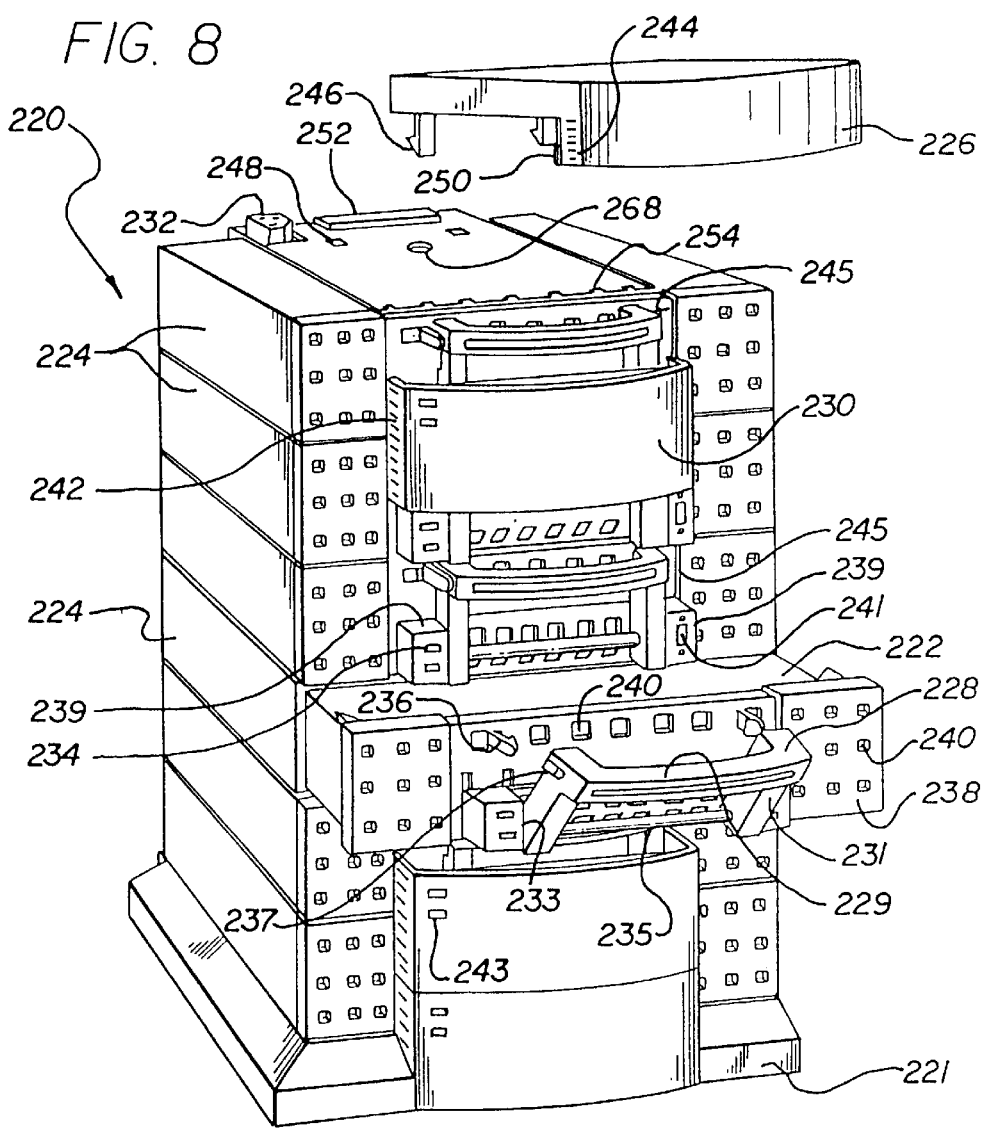
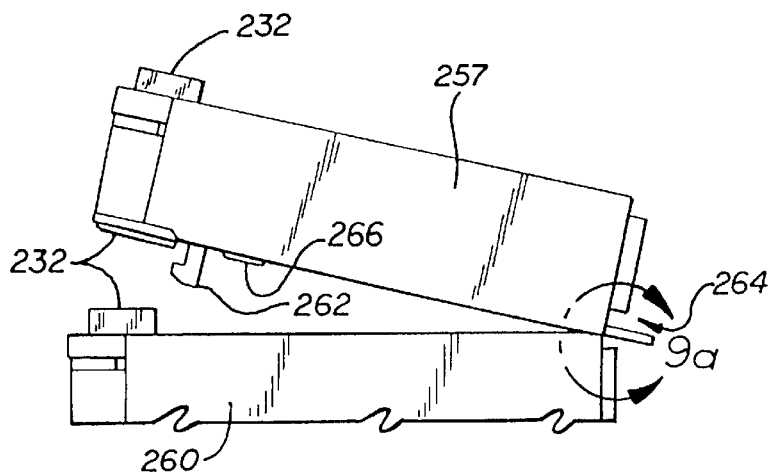
FIG. 8
FIG. 9
FIG. 9a

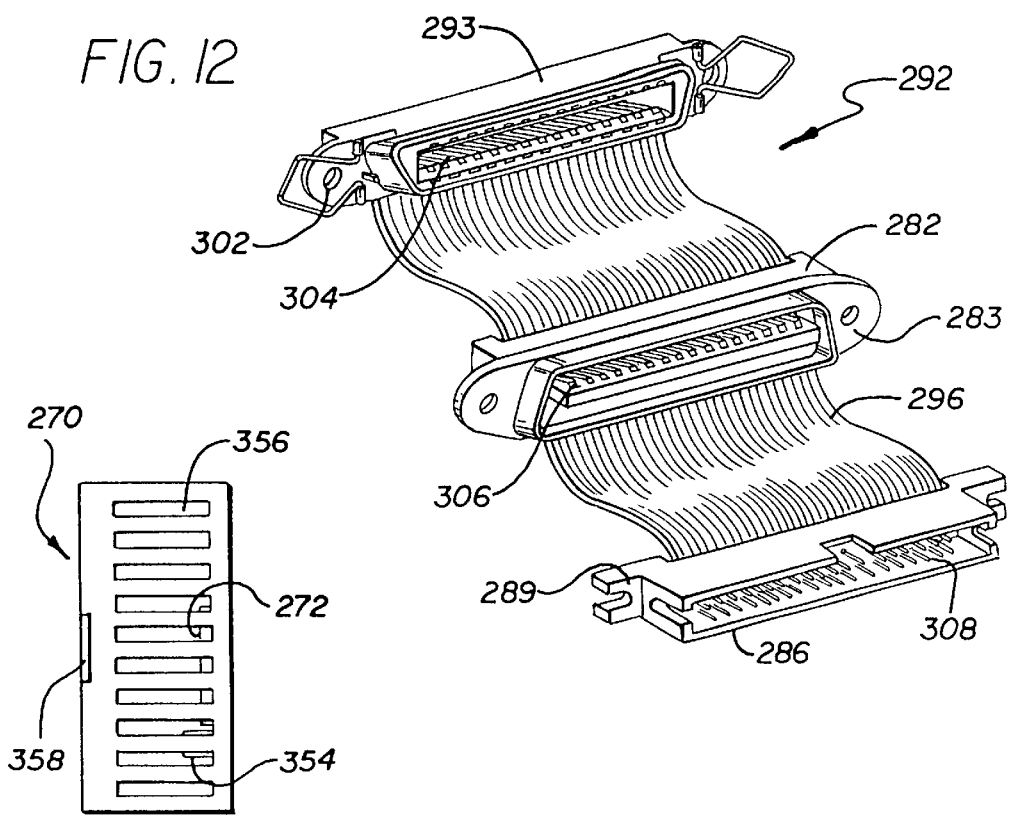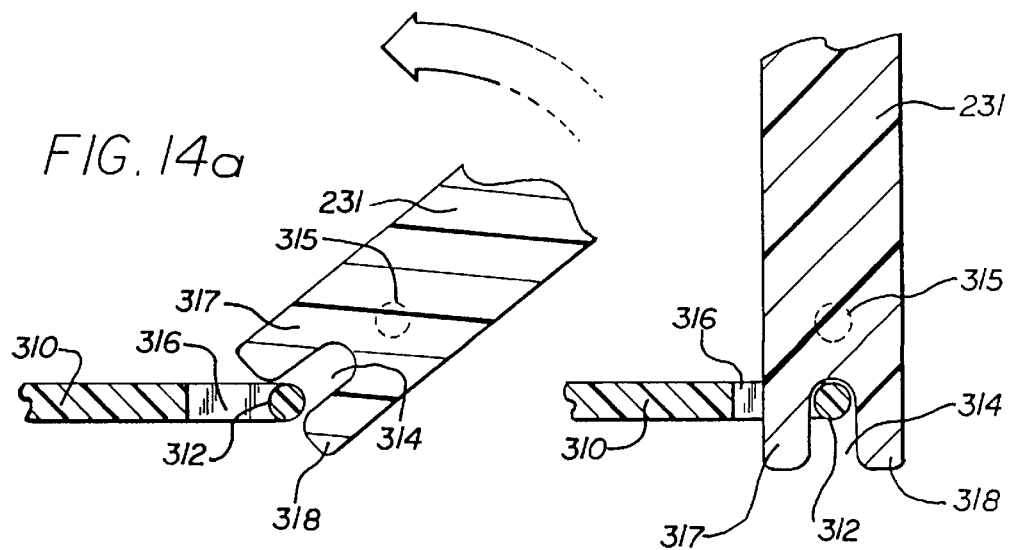

EXPANDABLE MODULAR DATA STORAGE SYSTEM HAVING PARITY STORAGE CAPABILITY

REFERENCE TO PRIOR APPLICATIONS

This application is a continuation of application Ser. No. 08/592,115, filed Jan. 26, 1996, now abandoned, which is itself a continuation-in-part of application Ser. No. 08/562,559, filed Nov. 20, 1995, now U.S. Pat. No. 5,604,662, which is itself a continuation of application Ser. No. 08/345,492, filed Nov. 28, 1994, abandoned, which is itself a continuation of application Ser. No. 07/932,794 filed Aug. 20, 1992, abandoned, and of U.S. application Ser. No. 08/027,668, filed Mar. 8, 1993, abandoned.

FIELD OF THE INVENTION

The present invention relates to data storage systems and, more particularly, data storage systems for storing and backing up data in an expandable data storage device array.

BACKGROUND OF THE INVENTION

Hard disk drives are well known and commonly used storage devices. Accordingly, although the present invention is not limited to use with hard disk drives, they will be used to illustrate the background of the invention and problems associated with the prior art.

In the field of digital data storage systems, most commercial computers employ Winchester-type disk drives to store program software and data. The predominant commercial hard disk drive standard is referred to as the 5¼" disk drive. Recent advances in hard disk drive technology have resulted in a new disk drive standard, commonly referred to as the 3½" disk drive, which can store considerably more data in a substantially smaller configuration as compared to earlier 5¼" disk drives. The storage capacities of these smaller 3½" disk drives continue to increase, with the 2112 series units made by Micropolis, the Assignee of the present invention, now having a storage capacity in excess of one gigabyte (equivalent to 1,000 megabytes). A "byte" of digital information includes eight binary digits or "bits" of information, and one gigabyte represents one billion bytes or eight billion (8,000,000,000) bits of digital information.

The data storage capacity of a particular disk drive depends on the user's anticipated storage requirements. However, it is often difficult to add data storage capability to a computer system once it has been configured. This difficulty is usually more dominant with personal computer type systems, but can present itself with work stations and larger systems.

External disk drive storage systems have provided the capability for adding internal or external disk drives to replace or augment the internal disk drive of a personal computer or work station. Adding such components may result in a number of problems related to power supply. In most systems, a single power supply is coupled to a number of individual peripheral components, including disk drives. The capacity of the system power supply is predetermined, and is based on the expected load that the system is anticipated to draw. Increasing the number of peripheral devices, or the capacity of peripheral devices such as disk drives, results in a requirement for additional power which may have been unanticipated. As a result, it may be necessary to replace the power supply once it has been determined that it is necessary to expand the system capabilities.

When the power supply capabilities are expanded, an attempt is made to determine whether the new power supply will accommodate the future power supply requirements of the system. Future expansion beyond the anticipated load necessitates replacing the power supply again.

In addition to the issues discussed above with respect to changes in data storage capacity and power supply capability, disk drive failure presents still another challenge for computer users. The tremendous storage capacity of these state-of-the art disk drives allows the computer user to store vast amounts of data on a single disk drive. Any failure of the disk drive or its supportive components, such as a power supply or cooling fan, can compromise the integrity of the stored data and cause substantial delays associated with repairing the unit and regenerating the data.

In order to minimize catastrophic loss of data, numerous software products and hardware storage devices have been developed to "back-up" the data residing on the hard disk drive of a computer. Data are typically backed up on a daily or weekly basis which requires substantial time to transfer the data from the hard disk drive to an external storage device. Incremental backups can reduce backup time by transferring only those files that had been modified since the previous backup. In the event that a hard disk drive failure occurs, the computer must be taken off-line, the hard disk drive replaced or repaired, and the backed up data restored to the new or repaired disk drive from the external backup device, thereby resulting in appreciable computer down-time.

Local area networks (LANs) have now become the preferred way of sharing data amongst a plurality of remotely located computers. Typical LAN configurations include one or more file servers that store large volumes of commonly shared data and distribute this data to remote users over communication lines. An individual file server is typically comprised of three hard disk drive units which store, among other data, the network operating system software, user software, and user data.

The cost of individual file servers often precludes acquisition of additional backup file servers, which often remain idle until needed, to replace a primary file server should the primary server fail. When a backup file server is available, data must be transferred to the backup server from an external storage device, typically a high density magnetic tape storage system. All data generated subsequent to the last backup, however, are usually lost.

Computer and network down-time can severely impact user productivity and often results in the loss of vital data. To minimize data storage system down-time, a method of simultaneously storing data on a plurality of disk drive units, often termed as "mirroring" data, has been developed to prevent the destruction of data and reduce system down-time resulting from hard disk drive failures. These "fault tolerant" storage systems, however, are often prohibitively expensive, occupy significant floor space, require special environmental cooling control and, most significantly, require the system to be taken off-line to repair one or more of the defective disk drive units.

Fault tolerant systems may also be vulnerable where the plurality of included disk drive units share a common power supply and/or disk controller circuitry which can compromise system integrity should a failure in these critical components occur. Furthermore, many multi-drive storage systems are housed in a chassis having a predetermined configuration which provides space for only a limited number of disk drive units, typically three such units, making expansion of data storage resources quite expensive. In many cases, one of the included disk drive units is wholly or partially dedicated for storing parity data which provide information regarding the data stored on the remaining disk drive units.

Moreover, such fault tolerant systems are configured such that the plurality of disk drive units are connected in parallel, with no capability to partition or segment the system into two or more independent sub-systems. Such systems may not provide the flexibility or capability to interconnect the plurality of disk drives in series as to mimic a single disk drive, with the total storage capacity being equal to the cumulative capacities of the individual disk drives.

Prior fault tolerant system designs, similar to those disclosed in U.S. Pat. No. 4,870,643 (Bultman et al.) and U.S. Pat No. 4,761,785 (Clark et al.), suffer from many of the deficiencies discussed hereinabove. Neither of the references cited above incorporates the advantages of expandability and flexibility inherent in the present invention.

OBJECT AND SUMMARY OF THE INVENTION

The general object of the present invention is to provide a data storage system which obviates, for practical purposes, the aforementioned problems is the art. In particular, one object of the present invention is to provide a reliable, high capacity, high data rate, and relatively inexpensive modular data storage system easily expandable to meet high storage and back up storage capacity requirements.

In order to accomplish these and other objectives, the present invention includes a plurality of data storage devices for storing data and parity data transmitted from a host computer, a plurality of substantially identical, vertically stackable storage device housings adapted to slidably receive a data storage device, and a mechanical connection device for releasably connecting the top of one storage device housing to the bottom of another.

In accordance with one aspect of the invention, a plurality of hard disk drive assemblies are removably installable in substantially identical stackable housings with signal and power connectors interconnecting the housings and disk drive assemblies. A pivotal handle lever latch may be provided on each disk drive assembly for securing the disk drive assembly in its respective housing and for securely mating disk drive assembly and housing signal and power connections. Alternatively, short interconnection cables may be provided to connect each of the modules together in order to route electrical power between the modules, as well as routing data transfer signals including data intended to be stored on the modules and parity data which is indicative of the stored data.

Another aspect of the present invention involves the modular design of the array in which peripheral storage devices, such as hard disk drive assemblies, are removably installable in substantially identical stackable housings. Expansion of the modular array is easily accomplished by including additional stackable housings to the array. The modular housings may be attached to one another through the use of screws or other fasteners. Alternatively, the modular housings may be provided with flexible latching members extending from one housing and being received and secured in the adjoining housing, thereby eliminating the need for tools, screws or other additional fasteners to secure the array. The "snap-together" modular assembly housings may easily be disassembled by disengaging the flexible latching members.

In accordance with still another aspect of the invention, a base may be employed to support the disk drive assembly housings, with the lowermost assembly housing in the array preferably being secured to the base by flexible latching members on the lowermost housing. Power and signal connectors may be integrally included in the base providing external power and signal connectivity with the array and communicating with a host computer.

In one embodiment of the present invention, each modular housing includes an integral power connector whereby an expanding power bus, or backplane, is formed with the addition of each modular housing to the array. The power connector is preferably comprised of a top connector oriented vertically toward the upper surface of the housing, a bottom power connector oriented vertically toward the lower surface of the housing, and an interior power connector included in the interior of the housing and oriented horizontally. Expansion of the array involves the automatic coupling between the bottom power connector of a newly added housing with the top power connector of the uppermost housing in the array when the additional and uppermost housings are "snapped-together." Similarly, the top power connector of the newly added housing automatically connects with the bottom power connector of the next housing added to the array. The integral power connectors of adjoining housings making automatic power connection eliminates the need for external power lines and manual interconnection of power lines.

The invention may also involve the use of flexible signal connectors integrally installable in each modular housing which provide signal connectivity between adjacent housings and each installable disk drive assembly. Thus, the signal bus, or signal backplane, expands with the addition of each housing to the array. An installable external input signal connector providing direct connectivity between a selected disk drive assembly within the array and an additional external host processor may also be provided. In one array configuration, as previously discussed, the flexible integrally installable signal connectors of each housing in the array may be configured to form a single common signal bus. Alternatively, an external input signal connector may be substituted at any housing position in the array, thereby providing direct access to an additional host processor and, consequently, partitioning or segmenting the array into two independent sub-arrays. Moreover, external input signal connectors may be installed in one or more housings in the array to provide disk drive assembly connectivity with an equivalent number of external host processors, thereby further partitioning or segmenting the array into a plurality of independent sub-arrays. Accordingly, data may be stored on any of the disk drives comprising the array with parity data for such stored data also storable on any of the disk drives.

In accordance with this aspect of the invention, one or more disk drive assemblies may be removed from the array during operation without adversely affecting the operation of the remaining disk drive assemblies. In the event that a malfunction occurs in a specific disk drive assembly, the defective disk drive assembly can be "hot swapped," or removed from operation, whereby array operation is unaffected by the removal and subsequent replacement of the defective drive. The data which were stored on the defective drive may then be reconstructed on the new replacement drive by performing simple logic functions on the parity data and other data contained in that particular data address. Accordingly, all the data are backed up through the use of parity information.

Another feature of the invention involves latches which may be provided on the sides of each disk drive assembly to secure the disk drive assembly in its respective housing. Alternatively, a pivotal handle lever latch which may be included on each disk drive assembly for securing the disk drive assembly in its respective housing and for removing the disk drive assembly when necessary. A further aspect of the pivotal handle lever latch involves the secure mating of the disk drive assembly signal and power connectors with the housing signal and power connectors upon the actuation and securing of the pivotal handle lever latch in the closing direction. Similarly, actuation of the pivotal handle lever latch in the opposite direction disengages the mated signal and power connectors and provides an easy means for removing the disk drive assembly from its respective housing.

A somewhat related feature involves the automatic power connection made between the disk drive assembly power connector and its respective housing power connector when the disk drive assembly is slid into its housing. The housing power connector is configured with the ground pin being longer than the power pins such that a ground connection between the disk drive assembly and the housing power connectors is established prior to connection of the power pins.

A further aspect of the invention involves front cover plates for covering at least a portion of the front surface of each housing, with the cover plates being secured on the front of the housing by hand-actuated flexible latching flanges outwardly extending from the front cover plates. Alternatively, the front cover plates may cover the entirety of the front of the housing.

Activity indicators and drive position identity switches constitute other features of the invention. In one illustrative embodiment of the invention, disk drive activity indicators, which may be light emitting diodes (LEDs), are included on each disk drive assembly and are visible through the front cover plates, preferably through slits in the front cover plates. If a disk drive assembly is working properly, a signal light display will so indicate. Any activity of an individual disk drive assembly is preferably indicated by an additional indicator.

An identification selection switch may be included on the front of each disk drive assembly for selecting and identifying the relative position of the particular disk drive assembly within the array, both to the user and to the host computer. The specific software controlling the array may dictate the manner in which the identity switches are set.

A further aspect of the invention involves rear cover plates for covering at least a portion of the rear of each housing, with the cover plates being securable on the rear of the disk drive assembly by hand-actuated flexible latching flanges outwardly extending from the rear cover plates. The rear cover plates may include a removable panel which, when removed, provides external access to the housing signal connector.

Independent air circulation and cooling ventilation may also be included in each disk drive assembly. The front and rear sides of the disk drive assembly include a plurality of perforations or vents which permit efficient introduction and expulsion of cooling air throughout the disk drive assembly.

In accordance with a preferred embodiment of the invention, the hard disk drive assemblies comprise 3½" Winchester-type disk drives.

A further aspect of the invention involves the modular disk drive assembly housings being fashioned from molded plastic, resulting in a highly durable yet low-weight housing assembly. All flexible latching members for securing the modular housings to one another and to the optional base are preferably integral with the molded plastic housing, thereby eliminating the need for tools and fasteners when assembling and disassembling the array.

Another feature of the present invention involves the distribution of data and parity information indicative of the data to three or more individual disk drives assemblies in order to provide redundant storing of the data, thus allowing for data recovery from the remaining operating disk drive assemblies if one or more disk drive assemblies fail to properly function. In accordance with another feature of the invention, data may be distributed to six or more individual disk drive assemblies within the array, thereby providing additional redundant data storage. However, the array of disk drive assemblies may also be configured such that the array responds as if it were a single storage device, the total storage capacity being the cumulative capacity of all disk drive assemblies within the array. "Hot swapping" of disks may take place, which is the replacing of a faulty disk drive with a new disk drive without the interruption of the operation of the storage system, analogous to that described in U.S. Pat. No. 4,870,643 to Bultman et al. mentioned above.

Another aspect of the invention involves the coupling of a host computer to the storage array using a standard SCSI (Small Computer Systems Interface) data protocol. Alternatively, other popular protocols, such as ESDI (Enhanced Small Device Interface) or IDE (Integrated Drive Electronics) may be employed. Data transfer rates of 5 megabytes per second are fairly common using the IDE interface, and transfer rates of 10 megabytes per second are common using the SCSI interface.

The above described and many other features and attendant advantages of the present invention will become apparent as the invention becomes better understood by reference to the following detailed description when considered in conjunction with the accompanying drawings.

BRIEF DESCRIPTION OF THE DRAWINGS

Detailed descriptions of preferred embodiments of the invention will be made with reference to the accompanying drawings.

FIG. 8 is a front perspective view of a disk drive storage array comprising six modular disk drive assembly housings in accordance with a third preferred embodiment of the present invention.

FIG. 9 is a diagrammatic representation of an upper modular housing being mounted on a lower modular housing in accordance with the embodiment illustrated in FIG. 8.

FIG. 9a illustrates the front mounting interface between the upper and lower modular housings illustrated in FIG. 9.

FIG. 12 is a detailed illustration of a housing signal connector providing external signal input.

FIG. 14a is a cross-sectional view of a handle lever latch actuation apparatus for securing individual disk drive assemblies in their respective housings.

FIG. 14b is a cross-sectional showing of the handle lever latch in a secured or latched configuration.

FIG. 18 is a side view of a detachable rear cover plate.

DETAILED DESCRIPTION OF THE PREFERRED EMBODIMENT

The following is a detailed description of preferred embodiments of the present invention. This description is not to be taken in a limiting sense, but is made merely for the purpose of illustrating the general principles of the invention. The scope of the invention is defined by the appended claims. In particular, although the preferred embodiment is described in terms of disk drives, such as Winchester-type disk drives, the present invention is intended to encompass a variety of data storage devices. For example, optical storage devices may be substituted for, or used in conjunction with, disk drives.

The First Preferred Embodiment

Figure 1:
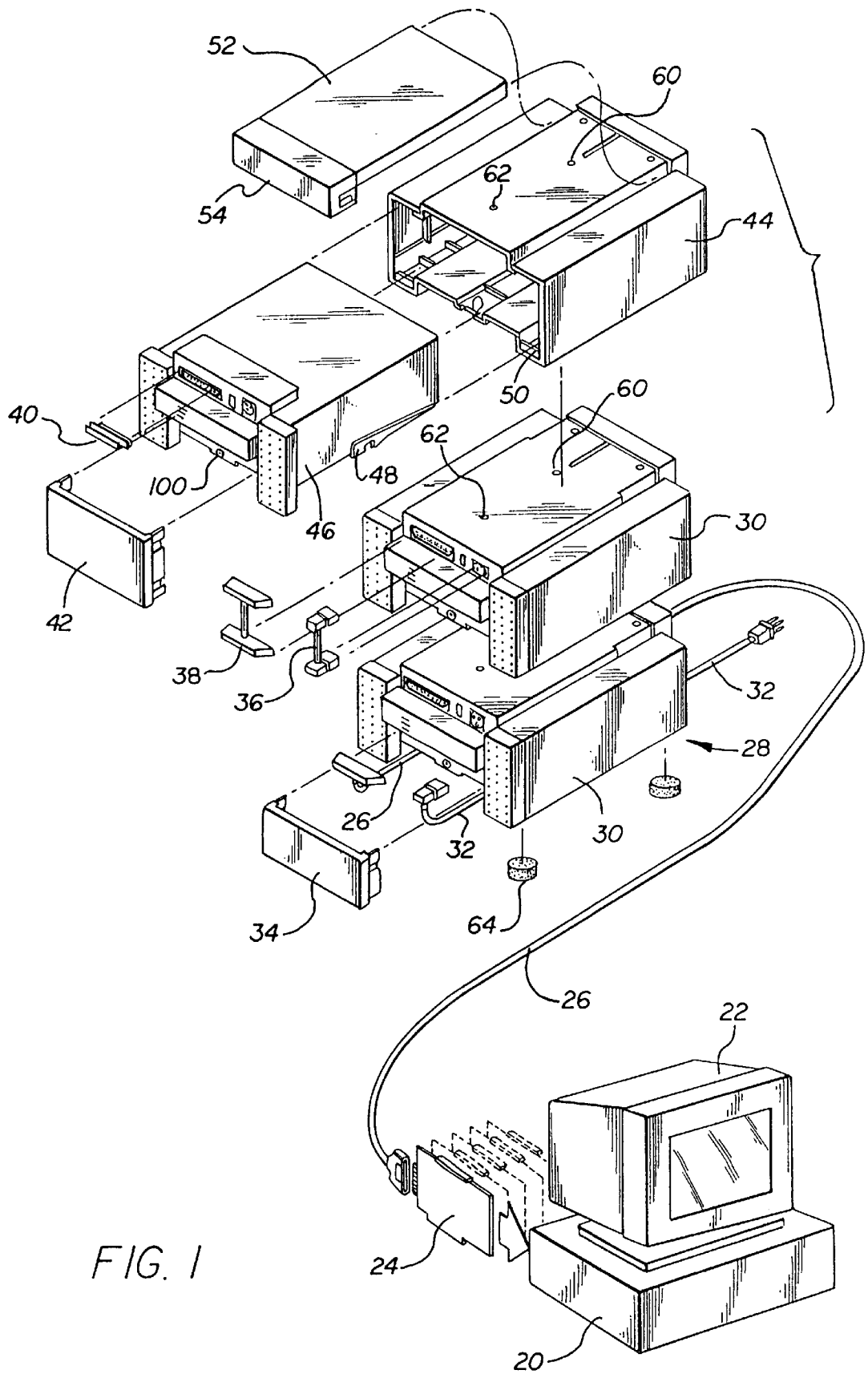
FIG. 1 shows the interconnection of the storage modules with a host computer in accordance with a first preferred embodiment of the present invention.

Referring to FIG. 1, a personal computer 20 having a monitor 22 and a keyboard (not shown) is connected to the expandable disk drive assembly 28 of the present invention by inserting a communication card 24, such as a SCSI adaptor card, into computer 20 and connecting it through cable 26 to system 28.

The expandable disk drive storage system 28 consists of one or more disk drive modules 30. Disk drive modules 30 may be stacked upon one another as shown in FIG. 1. They are fastened together to prevent the upper units from slipping with respect to the lower units by screws or other suitable fasteners. The bottom module 30 in the stack has a power cord 32 which connects the power supply in the bottom module 30 to a power source, such as 110 volts alternating current available from most appliance outlets. Bottom module 30 is also connected to personal computer 20 through cable 26. These connections are made in the front of module 30. Panel cover 34 snaps into the front, lower portion of bottom module 30 to cover the power connector and cable 32 as well as the computer connector and cable 26. Non-skid feet 64 are attached under bottom module 30 to prevent bottom module 30 from sliding on a table or other work surface.

Successive modules 30 are placed on top of the bottom module 30 and fastened by suitable fasteners to prevent the modules from moving with respect to each other. Interconnection between adjacent modules 30 is accomplished by power connector assembly 36 and computer connector assembly 38. These connectors are extremely short in length, and the interconnections are accomplished from the front of the modules 30. This avoids the need to route individual power cables 32, or computer interconnection cables 26, for each of the modules added to the system. Additionally, by providing all of the interconnection wiring on the front of module 30, it is not necessary to swivel the modules around to access the rear panel, or rear portion of modules 30, in order to interconnect them with the computer 22, or each other. This also eliminates the need to route interconnection cables from the front of one module 30 to the rear of a subsequent module 30.

Modules 30 consist of an outer housing or case 44 and an internal, removable assembly 46. Assembly 46 is slid into case 44 along tracks 50. Latches 48 located on both sides of removable assembly 46 prevent removable assembly 46 from sliding out of housing 44. A top panel 52 may be placed on top of the top module 30 of the stack. This provides for closure of the system, sealing assembly holes which are located on the top of the module 30. These assembly holes include holes 60 and 62 which are located in the top of each of the modules 30. Assembly holes 60 and 62 are threaded, and allow a case 44 to be fastened to a lower module 30 by placing screws through matching holes in the bottom of case 44 through threaded openings 60 and 62 of module 30 located beneath case 44. The removable assembly 46 is then slid into case 44.

Depending on the particular data transfer protocol selected, it may be necessary to provide a resistive terminator such as terminator 40 on the connector of the last module in the chain of the system. This reduces or eliminates signal reflection at high frequencies due to an unterminated transmission line. A connector panel 42 is snapped into the front section of adjacent modules 30 to cover connectors 36 and 38, and provide a more aesthetically pleasing appearance of the system. Top panel 52 has a front portion 54 which covers the terminator 40 and connector area of the top module 30.

Figure 2:
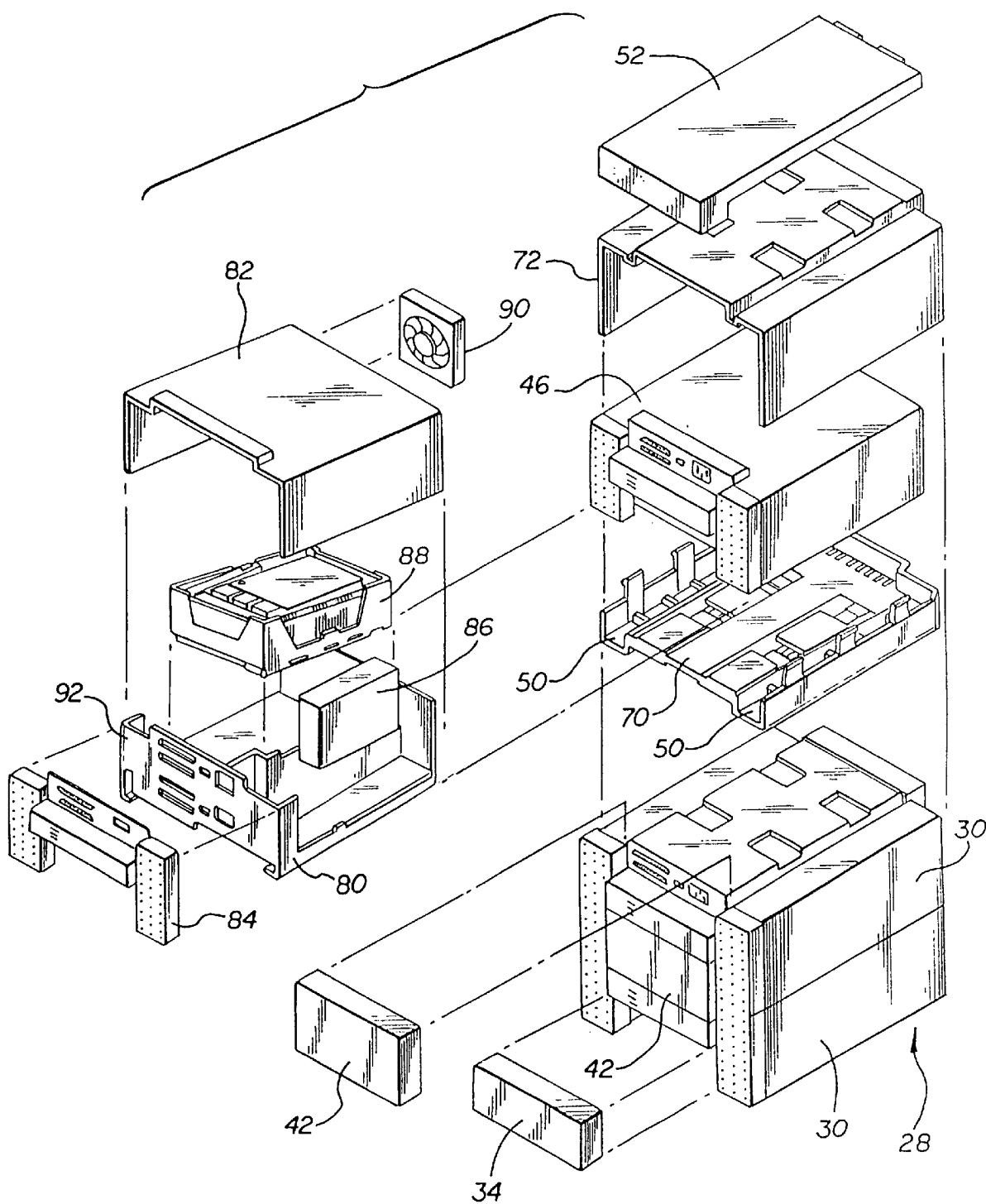
FIG. 2 is a detailed assembly drawing of the embodiment illustrated in FIG. 1.

Referring to FIG. 2, the lower portion of the disk drive expansion stack 28 is shown in a partially assembled condition. A bottom module 30 with a front panel 34 is shown located beneath a middle module 30. Connector panel 42 is shown located beneath lower module 30 and middle module 30. Upper module 30 is shown broken apart so that it can be seen in more detail. Outer case 44 as shown in FIG. 1 is a two-part assembly consisting of a base 70 and a top cover 72. Removable assembly 46 is shown located between base 70 and outer cover 72. Tracks 50 are located on the left and right sides of base member 70. For the purposes of explanation, removable assembly 46 is also shown in an expanded view.

Removable assembly 46 consists of a base tray 80 and a tray cover 82 which fit together to enclose power supply 86 and disk drive 88 within removable assembly 46. Fan 90 is affixed to the rear portion of base tray 80 (and is more clearly visible in FIG. 5). A front bezel 84 is affixed to the front portion of base tray 80. Bezel 84 and the front of base tray 80 have selected openings for the placement of connectors for interconnection of both power and computer data transfer signals. Bezel 84 also provides assembly points which meet with connector panel 42.

Figure 3:
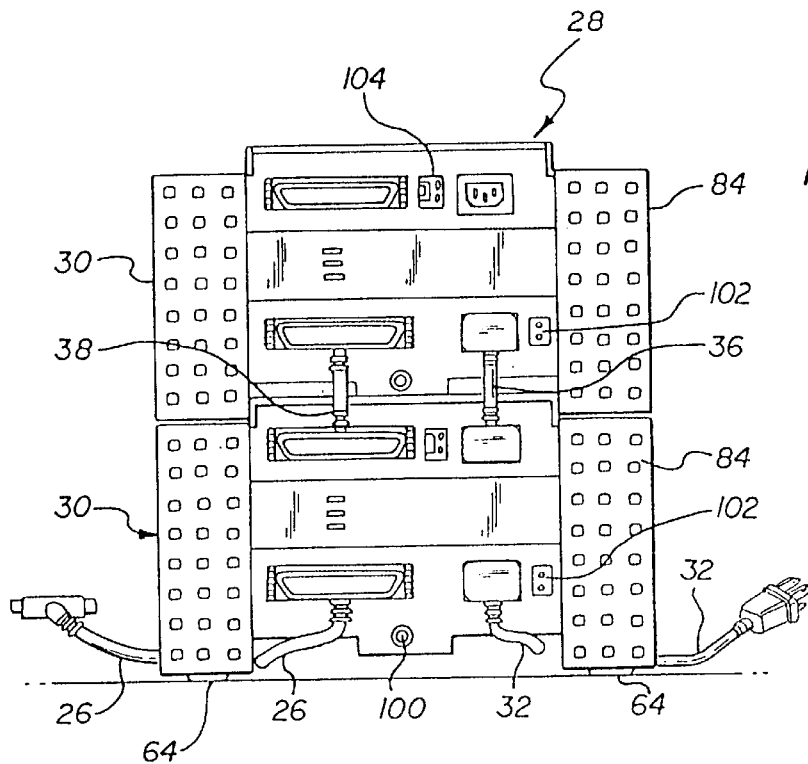
FIG. 3 is a front view of two modules shown in FIG. 1 in a fully assembled state.
Figure 7:
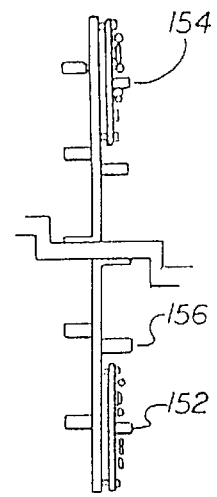
FIG. 7 illustrates an electrical connection board in accordance with the embodiment illustrated in FIG. 6.

FIG. 3 shows a front view of the disk drive expansion system 28 for two modules 30. As shown, bottom module 30 rests on feet 64. Power cable 32 is routed underneath the center portion of bottom module 30 and connects to bottom module 30 near the front, lower portion of bottom module 30. Disk drive interface cable 26 is similarly routed beneath the center portion of bottom module 30 and connects computer 20 as shown in FIG. 1 to the lower portion of bottom module 30 as shown in FIG. 3. Cables 36 and 38 provide power and computer signal interconnection, respectively, to interconnect bottom module 30 with the upper module 30 of FIG. 3. A set screw 100 secures the removable drive assembly 46 as shown in FIG. 1 to the case 44. This provides additional security to prevent the removable assembly 46 from sliding out of case 44.

A power switch 102 is located near the lower power feed of module 30. In FIG. 3, a power switch 102 can be seen to the right of the interconnection of power cable 32 with lower module 30. Power switch 102 of the upper module 30 is located to the right side of interconnection cable 36.

Similarly, an address select switch 104 is located near the upper portion of module 30 in between interconnection cables 36 and 38. Selection switch 104 is used to select the address of the particular disk drive or peripheral. Address selection is required with SCSI protocols, as well as a variety of other computer interconnection formats. The address selection switches shown in FIG. 3 both indicate address zero being selected. In actual use, it is necessary to use different addresses for each module 30 which is attached to expansion stack 28.

Figure 5:
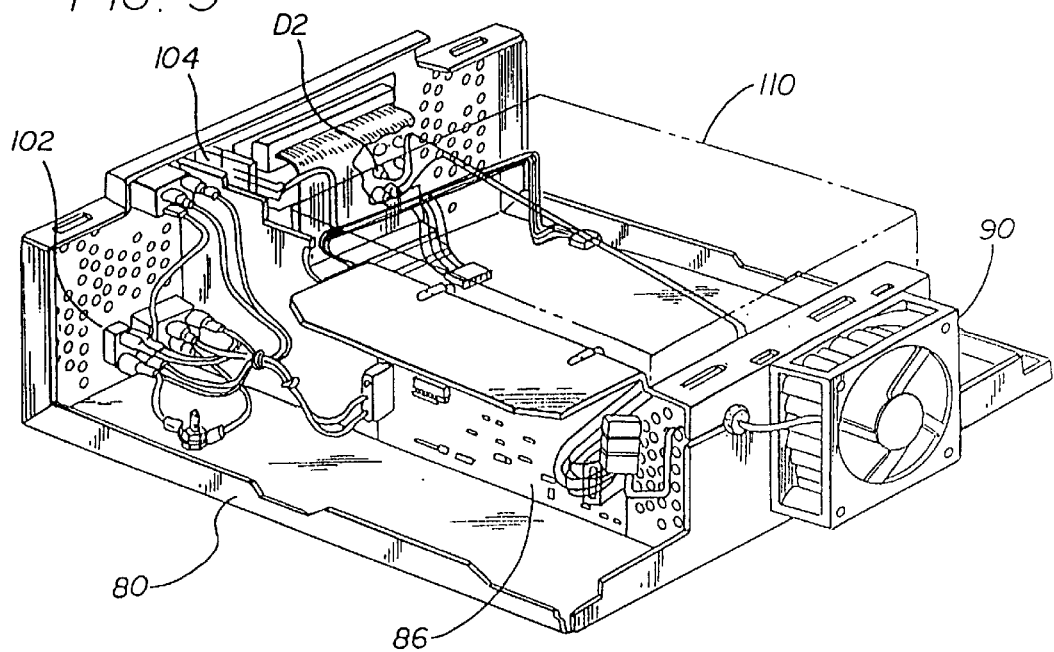
FIG. 5 is an illustration of the physical layout of the modules of the embodiment illustrated in FIG. 1.
Figure 4:
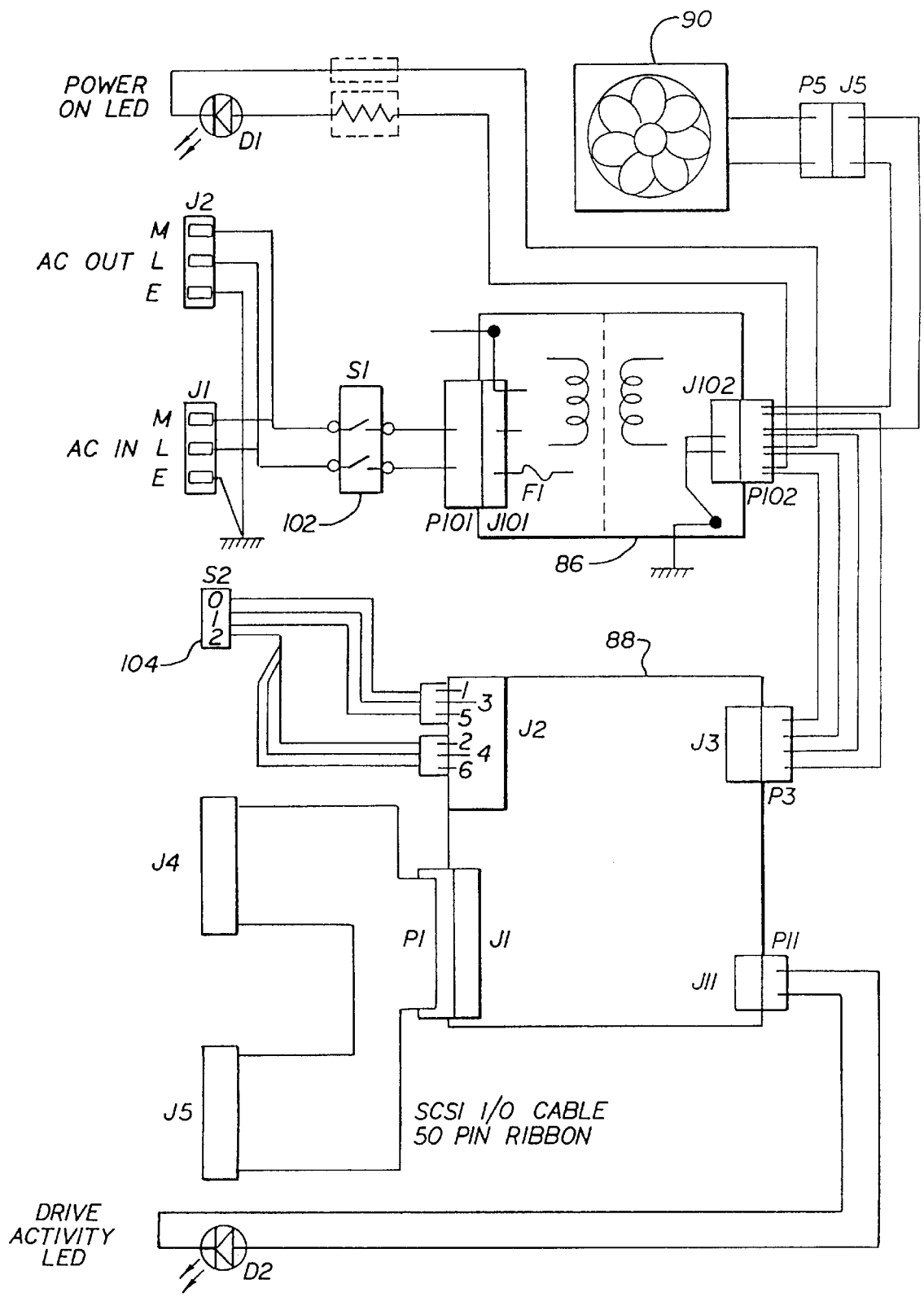
FIG. 4 is a schematic diagram of the circuitry of the modules of the embodiment illustrated in FIG. 1.

Referring to FIG. 4, a schematic of the wiring interconnection of module 30 is shown. The physical layout of this wiring harness assembly is shown in FIG. 5. Incoming power is supplied to the lower connector J1 which is wired in parallel with output power connector J2 so that power can be routed to the next module 30. Switch 102 connects the incoming power supply to power supply 86. Power supply 86 converts the incoming power supply waveform, typically 110 volts AC, to suitable direct current (DC) waveforms to power drive 88 and fan 90. The size of the power supply may vary from module to module. Selection switch 104 is connected to the address section of drive 88 and enables a user to select the address of each drive of expansion stack 28 without having to locate and select jumpers on the disk drive board. It also enables the user of a disk drive to easily set the address required without forcing the user to examine the internal workings of a module, or computer peripheral system, something which is still feared by many in this day of "computerization."

A computer interconnection cable such as a SCSI interface cable is attached to connectors J4 and J5 as shown in FIG. 4. Connectors J4 and J5 route the computer signal to disk drive 88, and allow interconnection of one module 30 to additional modules 30 through the use of the second connector.

A drive activity light omitting diode (LED) D2 is connected to drive 88. The drive activity LED D2 is activated by drive 88 to indicate to a user when the drive is enabled, and data are being accessed or written.

Referring to FIG. 5, the relative locations of power supply 86, fan 90, and the connector and switch assemblies as they are mounted in base 80 are shown. Disk drive 88 is located in area 100, and is not shown for clarity so that the wire harnesses can be more easily seen.

One advantage of this embodiment of the present invention, as well as the other preferred embodiments described below, is the ability to distribute data storage and parity information amongst several disk drives. If three drives are employed, data can be stored on two of the drives, and parity checking information for that data stored on a third drive. As a result, if any one of the disk drives fails to operate, all of the data can be restored by accessing the remaining two drives.

If one of the disk drives which contains data fails, that data can be reconstructed by comparing the parity information contained on the third drive with the data contained on the other data drive in order to determine which data have been lost and need to be reconstructed. Similarly, if the drive containing the parity information fails to operate, the two data drives already contain all of the valid data which can be used to reconstruct the parity information.

This eliminates the need to continuously back up data stored on disk drives in order to ensure that the data are not lost. Additionally, this data protection system may operate with a reduced redundancy as the number of disk drives increases. Using standard back-up techniques, a 100% redundancy, or full back-up copy, is required. Employing three drives, with two containing data and one containing one parity bit for every two bits of data, results in a 50% decrease in data storage in order to ensure that no data are lost. If four drives are employed, three of the drives can contain data and the fourth drive contains parity check information for the first three drives. In this configuration, the redundancy factor has been reduced to 33%. Similarly, if five disk drives were employed, data are stored on the first four, and parity information on the fifth. This results in only a 25% redundancy storage factor. As is the case for a three-drive system, if one of the five disk drives were to cease functioning, data and parity information on the remaining four can be easily used to reconstruct the missing data or parity information which was lost.

This technique can be employed as additional disk drives are added to the system. If a system is initially operating with three disk drives and a fourth is added, the storage protocol of the host computer in one embodiment will change and adapt to a four disk drive system, including data storage on three drives and parity information on the fourth. For that information which was only stored on the first three drives which were present in the system, the host computer will only look to those three drives for data and parity information.

The Second Preferred Embodiment

Figure 6:
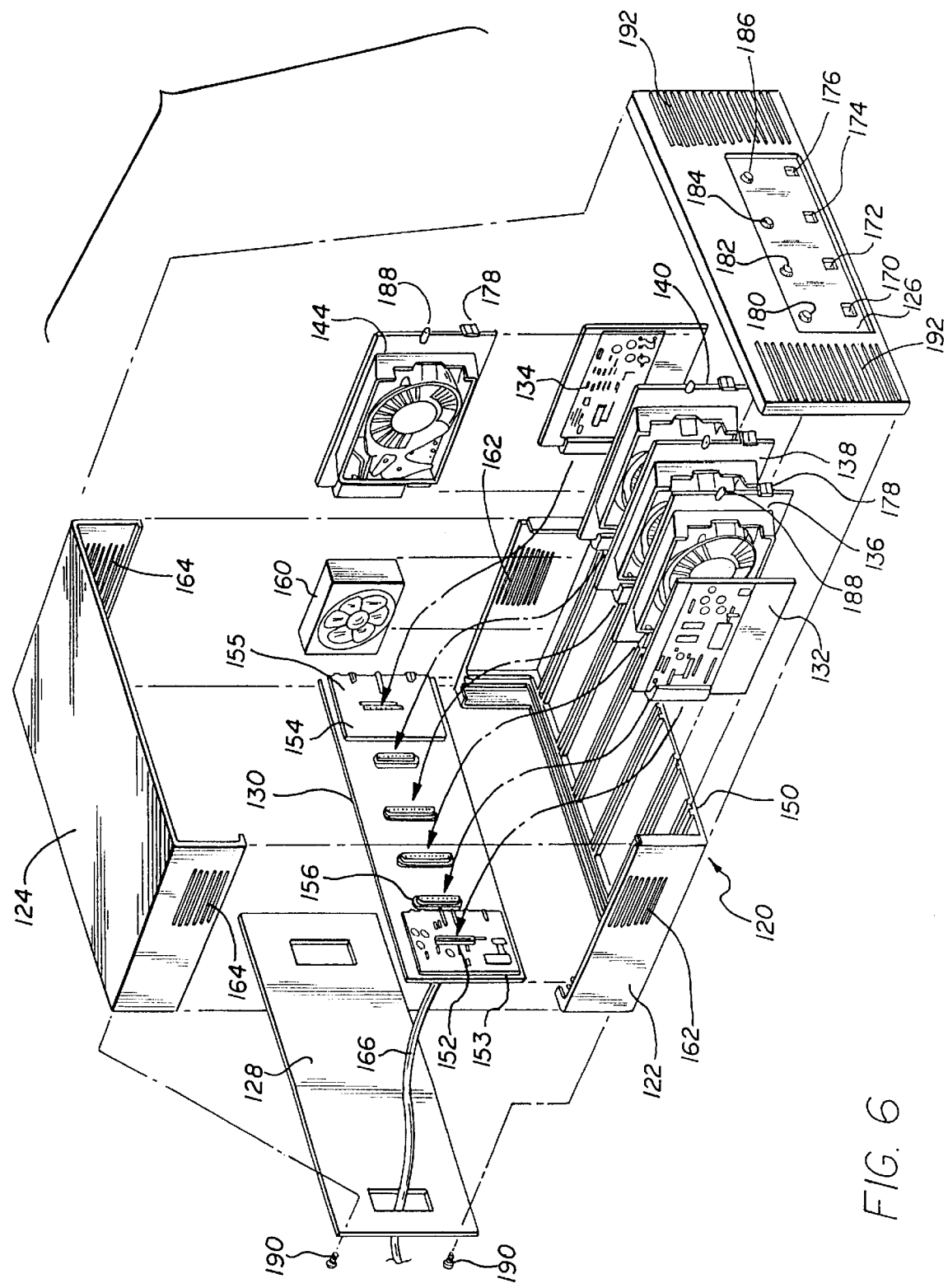
FIG. 6 is an illustration of a second preferred embodiment of the present invention.

Referring now to FIG. 6, a more compact peripheral expansion unit is shown. Unlike the system shown in FIG. 1, the configuration of FIG. 6 is not expanded by stacking additional modules on top of each other as modules 30 are stacked in FIG. 1. The implementation shown in FIG. 6 includes a bottom enclosure 122 and a top enclosure 124. A front bezel 126 is incorporated as the front structural member as well. This differs from the configuration of removable assembly 46 in which base tray 80 includes a front portion, and bezel 84 fits over the front portion of base tray 80 as shown in FIG. 2.

A rear panel 128 is attached to both the lower portion 122 and upper portion 124 of the enclosure by screws 190. A backplane 130 is located just in front of back panel 128. Backplane 130 provides interconnection for power supply modules 132 and/or power supply module 134. Backplane 130 also provides interconnection for several disk drives which are placed on carrier cards. These disk drives are individually identified as drives 136, 138, 140, and 144, but in practice are identical disk drive assemblies which may be "hard cards" or other hard disk drives which are attached to a mounting board. Power supplies 132 and 134, as well as disk drives 136, 138, 140 and 144, slide into the lower portion of the housing 122 through channels 150 which are preferably attached to (but may be formed within) the bottom half of enclosure 122.

Power supply 132 meets with connector 152 on a power interconnection board 153. Power supply cable 166 allows this power supply assembly to be connected to a power source (such as 110 volts AC). Similarly, power supply 134 is plugged into connector 154 located on power supply board 155. An additional power cable (not shown) allows board 154 to be connected with a power source. In certain configurations it may be desirable or preferable to interconnect boards 155 and 150 so that a single power supply line 166 may be used to provide a power source for the entire system.

A pair of thin, high volume fans 160 are placed on either side of the enclosure, adjacent to power supplies 132 and 134. Vent holes 162 are located in the bottom portion of enclosure 122, and similar vent holes 164 are located in the top portion of enclosure 124. Vent holes 162 and 164 allow air flow through enclosure 122 and 124 to allow cooling of the power supplies and disk drives.

Bezel 126 has two openings for each internal disk drive assembly. Each disk drive assembly includes a disk activation LED 188 and a selection switch block 178. Activity LED 188 is visible through openings 180, 182, 184 and 186 for disk drives 136, 138, 140 and 144, respectively. Similarly, switch blocks 178 are accessible through openings 170, 172, 174 and 176 for disk drives 136, 138, 140 and 144, respectively. Openings 192 near the outer portion of bezel 126 provide for additional air flow through the system. Preferably, the fans 160 are oriented to expel air out of vent holes 162 and 164. The in flow of air through openings 192 and rear panel 128 provide air flow to cool power supplies 132 and 134, and disk drives 136, 138, 140 and 144.

A computer interconnection cable (not shown) interconnects connectors 156 on motherboard 130 with computer 20 (as shown in FIG. 1). This may be the aforementioned SCSI interface protocol as is employed with the modular implementation described in FIGS. 1–5.

In order to allow the disk drives 136, 138, 140 and 144 to be easily mounted in the slots 150 of the bottom portion of enclosure 122, and interconnected to motherboard 130, the disk drives are mounted on rigid carriers which may also act as disk controller boards containing logic circuits, as well as providing mounting for LED 188 and switch 178.

The physical side of the disk drives shown in FIG. 6 is smaller than the size of the disk drives 88 as shown in FIG. 2. As a result, the disk drives shown in FIG. 6 are expected to have a lower storage capacity than disk drives 88. By providing a modular expansion system, a user can purchase only the amount of data storage that he believes he requires, and may easily add to it in the future as his needs expand. This allows the user to build on a single investment of an expansion system, without being forced to discard the previous expansion system each time the user wishes to increase his data storage capability. There is no restriction using the present system that each drive added to the system have the same storage capacity, or storage medium. It is possible with the present system to include so-called standard Winchester disk drives, drives which incorporate vertical recording of magnetic patterns, as well as optical storage drives within the physical configuration of the embodiments.

This embodiment may also be used to store data on two disk drives and parity information on a third. Adding a fourth drive to the system causes the host computer to distribute the data differently. The host system will attempt to evenly distribute the added information to ensure that the three disk drives which were originally in the system will not become filled to capacity while the added disk drive remains essentially empty. In this embodiment, once information which was previously stored on the three disk drives in the system is modified or added to, the files are rewritten by the host computer in order to distribute the data amongst the four disk drives presently in the system. The same principles apply when a fifth, sixth, seventh or subsequent disk drive is added to the system.

The Third Preferred Embodiment

Referring to FIGS. 8–18 and, more particularly, to FIG. 8, disk drive array 220 comprises a plurality of individual disk drive assembly housings 224 which are coupled together and to disk drive array base 221 with top cover 226 covering the uppermost disk drive assembly housing 224. The disk drive assemblies 222 are essentially identical in configuration, each being individually installable in its respective disk drive assembly housing 224. Each disk drive assembly 222 includes a front bezel 238 to which a handle lever latch 228 is mounted for sliding the disk drive assembly 222 into and out of its respective housing 224. Handle lever latch 228 releasably secures each disk drive assembly 222 in its respective housing 224 as handle latching fingers 236 engage handle latching grooves 237 positioned on opposite ends of main handle 229.

Handle lever latch 228 rotates about latch joints 233 with pivot arms (not shown) extending outward from the lower end of handle arms 231 being rotatable in bezel joint blocks 239. Disk drive assembly identity switch 241 may be mounted in one of the bezel joint blocks 239 which identifies the relative position of each disk drive assembly 222 within disk drive array 220. The particular identity switch setting is typically prescribed by the particular disk drive array software which orchestrates storage activity within disk drive array 220. Disk drive assembly activity indicators 234 may be mounted in the other bezel joint block 239. Activity indicators 234 preferably comprise two light emitting diodes (LEDs), one of which indicates a properly functioning disk drive assembly 222, while the other indicates disk drive assembly 222 activity associated with the transferring of data to and from the included disk drive.

The front bezel 238 of each disk drive assembly 222 includes a plurality of bezel vents 240 through which cooling air is introduced and/or expelled to allow cooling of disk drive assembly 222 during operation. Front cover plates 230 provide an aesthetically pleasing configuration in addition to concealing handle lever latches 228 mounted on front bezels 238. A plurality of front cover vents 242 included on the sides of front cover plates 230 allow air to flow into and out of individual disk drive assemblies 222. View ports 243 provide external viewing of activity indicators 234. Front cover plates 230 are preferably configured to cover portions of two adjoining disk drive assemblies 222, and are securable to front bezels 238 by hand actuated flexible latching flanges 242 extending outward from each side of front cover plates 230 being received in front cover plate flange slots 245.

Figure 16:
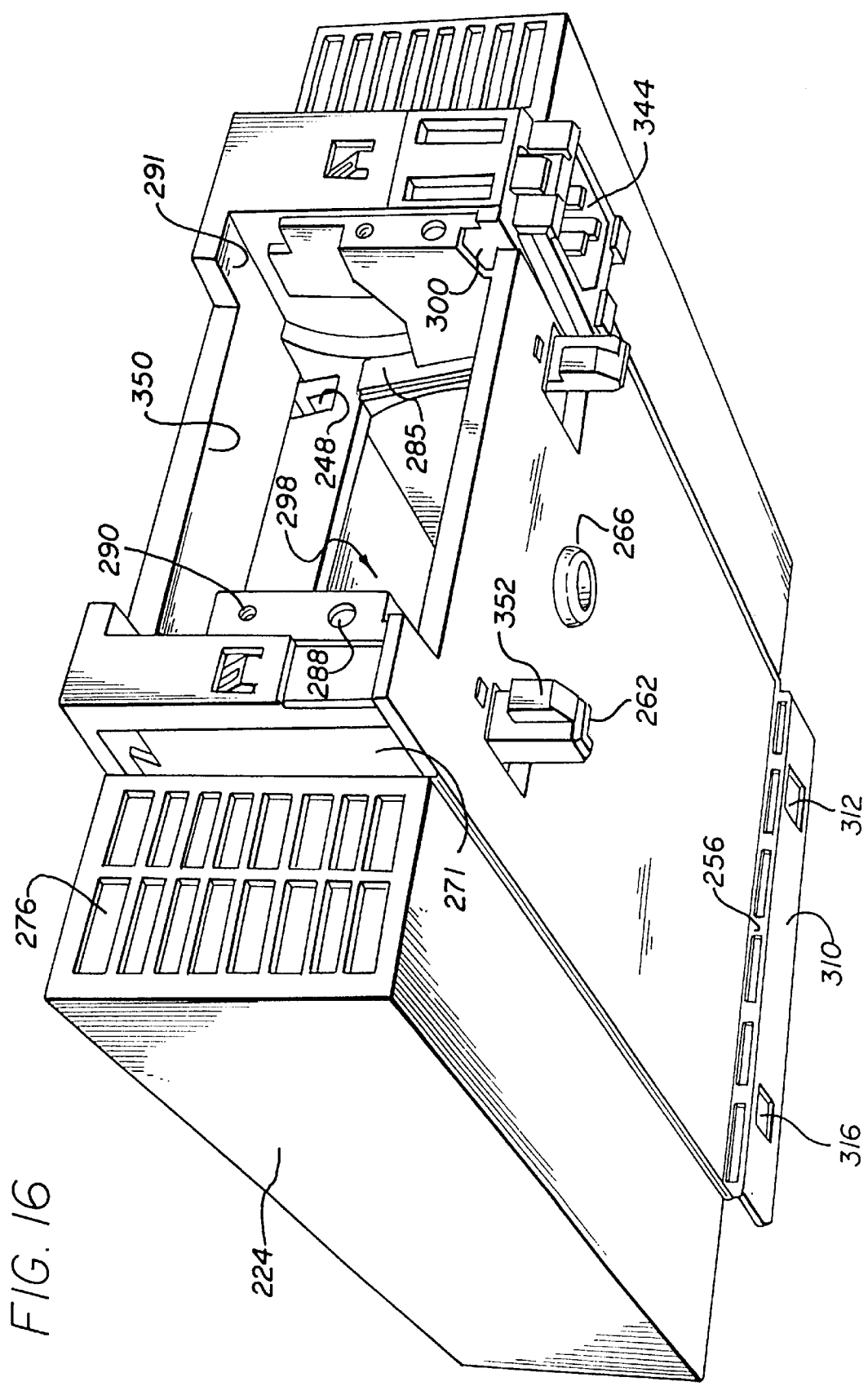
FIG. 16 is a rear perspective view of one of the assembly housings illustrated in FIG. 8 showing the lower surface of the housing.

FIG. 8 further illustrates the top of a disk drive assembly housing 224 with AC power connector 232 mounted vertically and configured to make automatic power connection with adjoining housing 224 power connectors 232. Latching member securing ports 248 receive and engage top cover latching members 246 for securing top cover 226 to the uppermost housing 224 of array 220. Top cover latching members 246 flexibly engage securing port ledges 350, as shown in FIG. 16, within latching member securing ports 248 which may be disengaged by applying sufficient horizontal force to decouple flexible latching members 246 from securing ledges 350 within latching member securing ports 248. Top cover 226 includes a plurality of top cover vents 244 which allow air to flow into and out of the uppermost disk drive assembly 222. The front of top cover 226 is releasably securable to front bezel 238 by hand actuated flexible latching flanges 250 outwardly extending from the sides of top cover 226 and being received in front cover plate flange slots 245. Signal connector terminator 252 may be included to terminate the top signal connector of the uppermost disk drive assembly housing 224. Depending on the particular data transfer protocol selected, it may be necessary to connect resistive signal connector terminator 252 to the signal connector of the uppermost disk drive assembly housing 224 to reduce or eliminate undesirable signal reflection associated with an unterminated transmission line.

The coupling of two adjoining disk drive assembly housings 224 is illustrated in FIG. 9. Upper housing 257 is preferably mounted on lower housing 260 by coupling the two housings 224 at front housing attachment interface 264 and then inserting housing latching members 262 into latching member securing ports 248 to "snap together" the two housings 224. Coupling guidepost 266 on the bottom surface of upper housing 257 registers with and is received by coupling guidehole 268, as shown in FIG. 8, to ensure proper seating of the two adjoining housings 224. As upper housing 257 engages lower housing 260, power connectors 232 automatically couple, thereby eliminating the need for external power wiring between adjoining disk drive assembly housings 224.

FIG. 9a provides a cross-sectional view of front housing attachment interface 264. Front coupling channel 256 of upper housing 257 engages front coupling lip 254 of lower housing 260 joining the two housings. When housing latching members 262 are securely received in latching member securing ports 248, front coupling lip 254 becomes securely seated in front coupling channel 256 and provides an integral front securing interface between the two housings 224.

Figure 11:
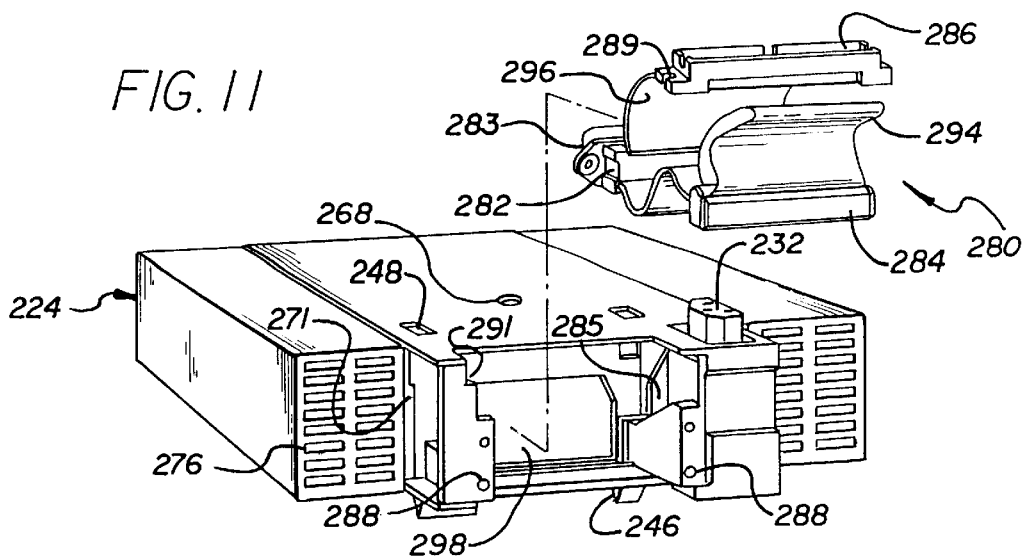
FIG. 11 is a rear showing of one of disk drive assembly housings shown in FIG. 10 and an individual housing signal connector.

The signal interconnections between adjacent disk drive assembly housings 224 within the expandable modular disk drive array 220 constitute a novel feature of the present invention. FIG. 11 provides an illustration of a flexible housing signal connector 280 which may be integrally installable into the signal connector opening 298 of each disk drive assembly housing 224. Housing signal connector 280 is comprised of an interior signal connector 282, a bottom signal connector 284, and a top signal connector 286. Flexible multi-line ribbon 296 interconnects bottom signal connector 284 and top signal connector 286 to interior signal connector 282. Housing signal connector 280 employs a parallel connection design such that signals received at bottom signal connector 284 are transmitted to interior signal connector 282 in parallel with top signal connector 286. Thus, signals may be transmitted through housing signal connectors 280 of adjoining disk drive assembly housings 224 undisturbed by the connection or disconnection of disk drive assemblies 222 with interior signal connector 282. The parallel construction of each housing signal connector 280 provides a signal bus, or backplane, that expands with the addition of each housing 224 to disk drive array 220. Most significantly, individual disk drive assemblies 222 may be removed from their respective housings 224 during operation of disk drive array 220 without adversely affecting the operation of the remaining drive assemblies 222, known in the art as "hot swapping."

Flexible housing signal connector 280 may be installed in housing 224 by sliding signal connector wings 283 of interior signal connector 282 within interior connector positioning slot 285. When interior signal connector 282 is properly seated in positioning slot 285, disk drive assembly signal connector 326 (shown in FIG. 13) automatically couples with interior signal connector 282 when disk drive assembly 222 is slid into its respective housing 224.

Top signal connector 286 is integrally installable in housing 224 by sliding top connector flanges 289, protruding outwardly from the sides of top signal connector 286, into top connector channel 291 which is dimensioned to securely restrain top signal connector 286 from movement in the vertical direction. Flexible multi-line ribbon 296 connecting top signal connector 286 with interior signal connector 282 is sufficiently pliable to allow easy insertion and removal of top signal connector 286 from top connector channel 291.

Bottom signal connector 284 may be manually connected to the top signal connector 286 of a lower adjoining disk drive assembly housing 224 and situated in bottom signal connector recess 300 (shown in FIG. 16), with flexible multi-line ribbon 296 allowing for easy manipulation of bottom signal connector 284. Bottom signal connector 284 may include signal connector pull tab 294 which may be useful when decoupling bottom signal connector 284 from the top signal connector 286 of a lower adjoining housing 224. Signal connector pull tab 294 is preferably constructed from pliable material which allows it to be easily positioned within signal connector opening 298.

Figure 10:
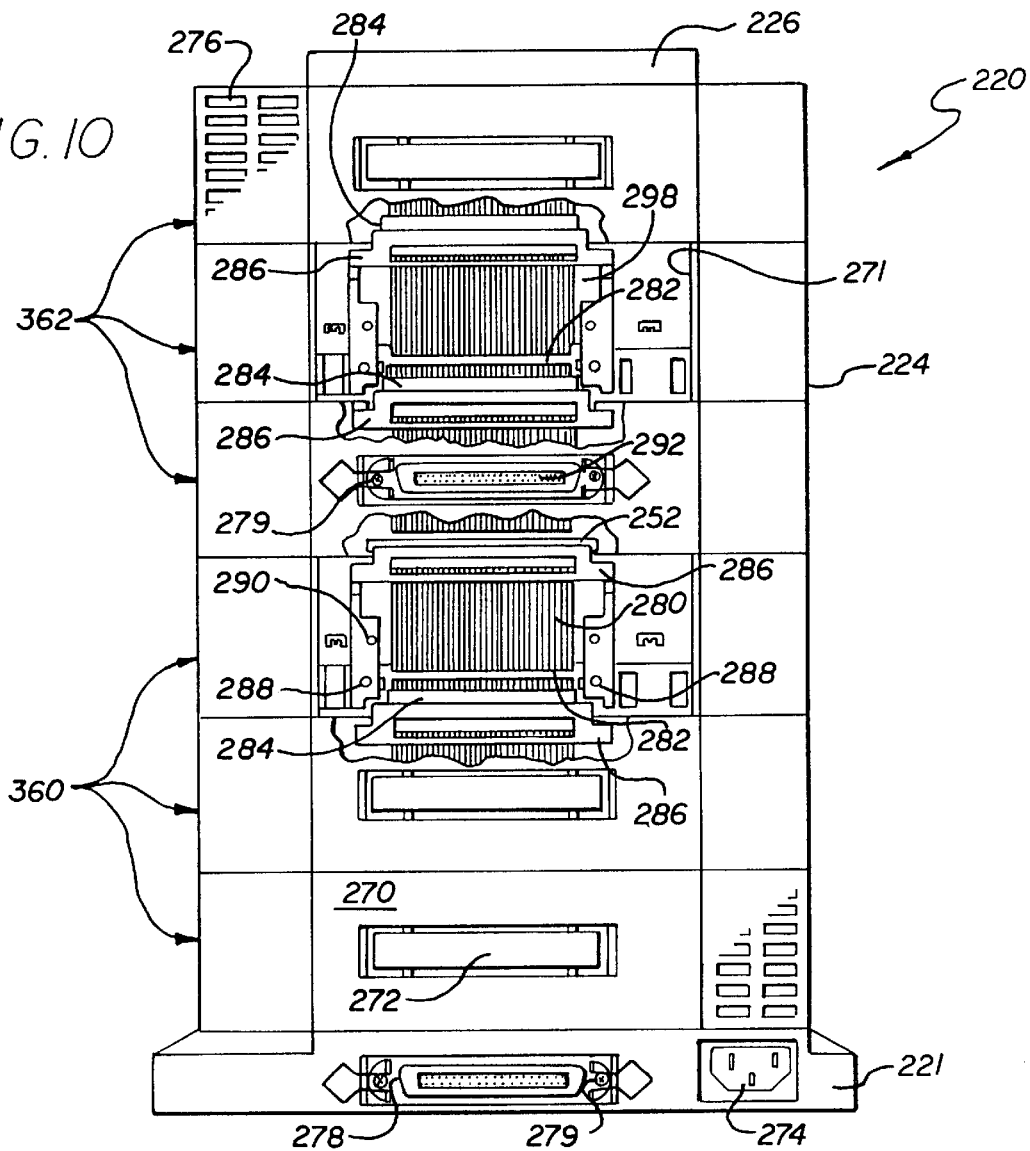
FIG. 10 is a rear view of the modular disk drive storage array shown in FIG. 8, with a detailed illustration of the signal interconnections for each housing and between adjacent housings forming the signal backplane of the modular array.

A rear view of disk drive array 220 is provided in FIG. 10 which illustrates both functional and aesthetic features of the present invention. Each disk drive assembly housing 224 includes a signal connector opening 298 into which a flexible housing signal connector 280 is removably installable. Rear cover plates 270 may be installed to cover housing signal connectors 280, with hand actuated flexible latching flanges extending outwardly from the sides of rear cover plates 270 which are insertable into rear cover plate flange slots 271. Each rear cover plate 270 may include a removable rear cover panel 272 to provide external access to signal connector opening 298.

The signal connector backplane as shown in FIG. 10 depicts a plurality of disk drive assemblies 222 interconnected with flexible housing signal connectors 280 installed in such a way as to partition disk array 220 into two distinct sub-arrays. In particular, the array of six disk drive assemblies 222 shown in FIG. 10 is partitioned, or segmented, into two separate and distinct sub-arrays, each comprised of three disk drive assemblies 222. The first sub-array 360 is comprised of disk drive array base 221 interconnected with the first three adjoining disk drive assemblies 222. The second sub-array 362 is comprised of the fourth, fifth, and sixth adjoining disk drive assemblies 222. Partitioning of disk drive array 220 into two distinct sub-arrays as described in the example hereinabove is accomplished by the inclusion of external input signal connector 292 in the fourth disk drive assembly position in array 220. A first host computer may interface with the first sub-array 360 through base signal connector 278. A second host computer may interface with the second sub-array 362 through external input signal connector 292 installed in the fourth disk drive assembly 222 position. The configuration of external input signal connector 292 is further illustrated in FIG. 12.

It should be noted that the segmentation of disk drive array 220 into two distinct sub-arrays as illustrated in FIG. 10 is illustrative of the interconnection flexibility inherent in the present invention. Disk drive array 220 may instead be interconnected as a single array of disk drive assemblies 222. Alternatively, external input signal connector 292 may be installed in one or more disk drive assembly housings 224 thereby providing an external interface to additional host computers and, consequently, further segmenting array 220. Moreover, external input signal connector 292 may be installed in each disk drive assembly housing 224 resulting in an array of independent disk drive assemblies 222 in which each disk drive assembly 222 interfaces with an independent external host computer. Although disk drive array 220 may be segmented as discussed hereinabove, each disk drive assembly 222 within the array 220 remains connected to a common power source originating at base power connector 274 and transmitted to each housing 224 through housing power connectors 232.

FIG. 10 further illustrates flexible housing signal connectors 280 as installed in each disk drive assembly housing 224 within disk drive array 220. Interior signal connectors 282 are shown connected to the signal connectors 326 of disk drive assemblies 222 installed in their respective housings 224. Bottom signal connector 284 is connected to top signal connector 286 of a lower adjoining housing 224. Top signal connector 286 is connected to bottom signal connector 284 of an upper adjoining housing 224. When it is desirable to expand disk drive array 220, an additional disk drive assembly housing 224 may be mounted to the uppermost assembly housing 224 and connected to the array signal bus, or backplane, by connecting bottom signal connector 284 of the newly added housing 224 with top signal connector 286 of the previously uppermost assembly housing 224. Alternatively, external input signal connector 292 may be installed in any assembly housing 224 in disk drive array 220 to segment array 220 as previously discussed. Signal connector terminator 252 may be installed to terminate the top signal connector 286 of the uppermost assembly housing 224 of an individual sub-array when necessary.

Rear vents 276 are included on the rear of each disk drive assembly housing 224 to freely permit the introduction and expulsion of cooling air into and out of disk drive assemblies 222. Rear cover plates 270, as illustrated in FIG. 18, include a plurality of rear cover vents 356 allowing ventilation air to pass through rear cover plates 270. Rear cover plates 270 are installable to cover signal connector openings 298 by hand actuated flexible rear cover flanges 358 being "snapped-in" rear cover plate flange slots 271. Proper alignment of rear cover plates 270 over signal connector openings 298 is ensured by rear cover guideposts 354 on the interior of each rear cover plate 270 registering and mating with rear cover guideholes 288.

FIG. 12 provides a detailed illustration of external input signal connector 292. External signal connector 293 may be installed in any selected assembly housing 224 by connector screws 279 passing through screw through-holes 302 and being tightened in connector screwholes 290. External signal connector 293 is comprised of a multi-pin connector 304 having a standard configuration which interfaces with a mating signal connector typically from a host computer. Interior signal connector 282 is comprised of a multi-pin connector having a standard configuration which interfaces with signal connector 326 of disk drive assembly 222. Top signal connector 286 includes a multi-pin connector 308 which interfaces with a receiving connector incorporated in bottom signal connector 284. Flexible multi-line ribbon 296 interconnects external signal connector 293 and top signal connector 286 with interior signal connector 282, such that interior signal connector 282 and top signal connector 286 are connected in parallel.

Figure 13:
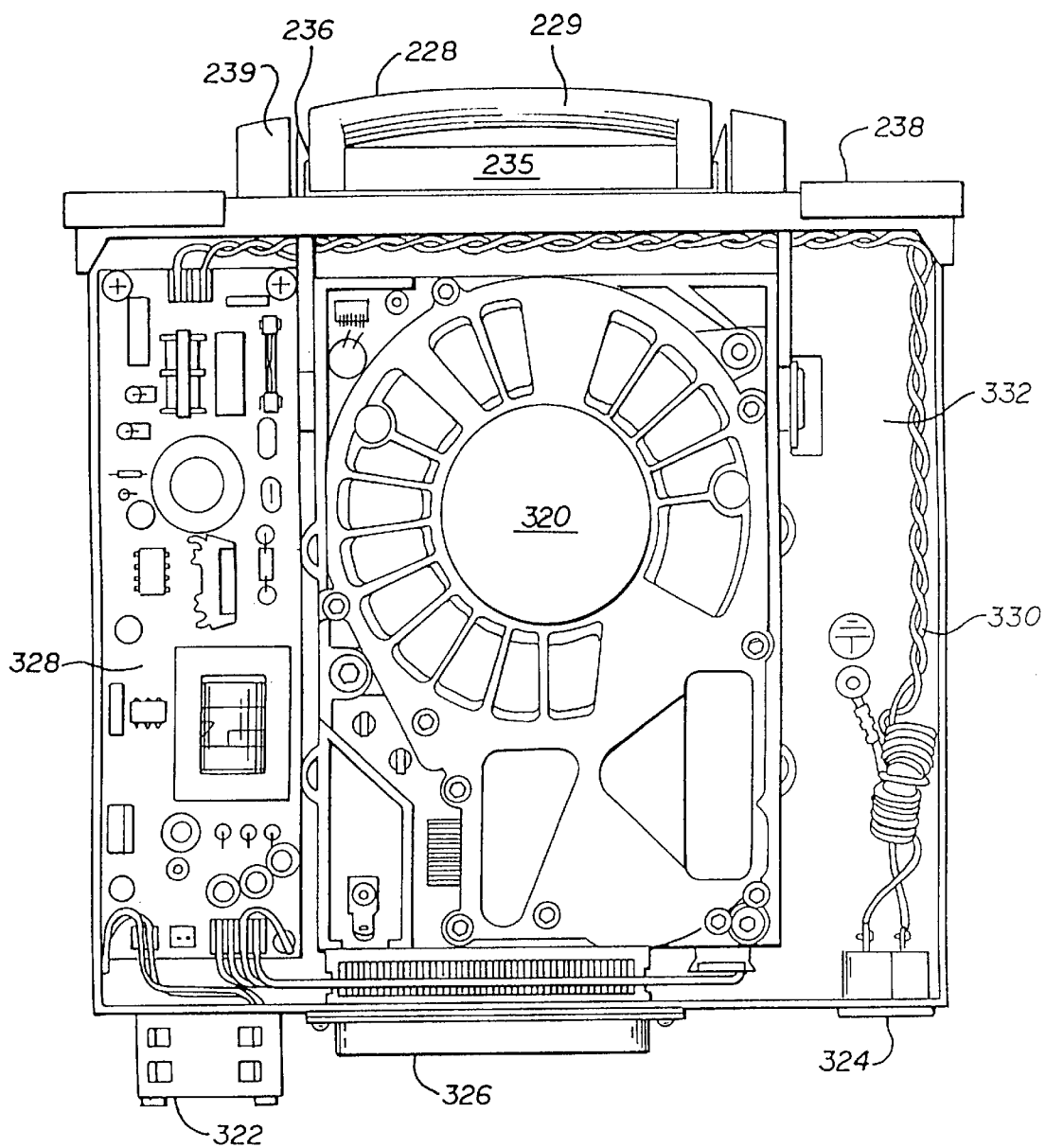
FIG. 13 is a top view of a disk drive and power supply assembly with the top cover removed.

FIG. 13 provides a top-view illustration of a disk drive assembly 222 with its top cover removed. Hard disk drive unit 320 is mounted to disk drive assembly chassis 332 with signal connector 326 and power connector 324 accessible from the rear of disk drive assembly 222. Cooling fan 322 provides sufficient air circulation over disk drive controller and power electronics 328 and throughout disk drive assembly chassis 332 to provide adequate ventilation and cooling. Hard disk drive unit 320 is preferably a 3½" standard disk drive, such as a 2100 series 3½" disk drive manufactured by Micropolis, the Assignee of the present invention. Handle lever latch 228 is shown in its closed or secured position, with handle latching fingers 236 engaging handle latching grooves 237.

Actuation of handle lever latch 228 is depicted in the cross-sectional illustrations of FIG. 14a and FIG. 14b. In FIG. 14a, the extreme ends of handle arms 231 include a pair of lever latch forks 317 and 318 separated by lever latch groove 314. Each disk drive assembly housing 224 includes an outwardly protruding lower housing shelf 310 with rectangular shaped shelf notches 316 positioned near the edge of lower housing shelf 310. Leverage bar 312 forms the extreme side of each rectangular shelf notch 316 along the edge of lower housing shelf 310 about which handle arms 231 pivot. As disk drive assembly 222 is slid into its respective housing 224, upper forks 317 pass over leverage bars 312 while lower forks 318 engage leverage bars 312. Leverage bars 312 enter lever latch grooves 314 while engaging lower forks 318. By exerting rotational force on main handle 229 of handle lever latch 228 in the direction indicated in FIG. 14a (toward front bezel 238), handle arms 231 rotate about pivot arms 315 within bezel joint blocks 239, with upper forks 317 passing over leverage bars 312 and through shelf notches 316. FIG. 14b depicts a fully actuated handle lever latch 228 in a closed, secured configuration.

Figure 15:
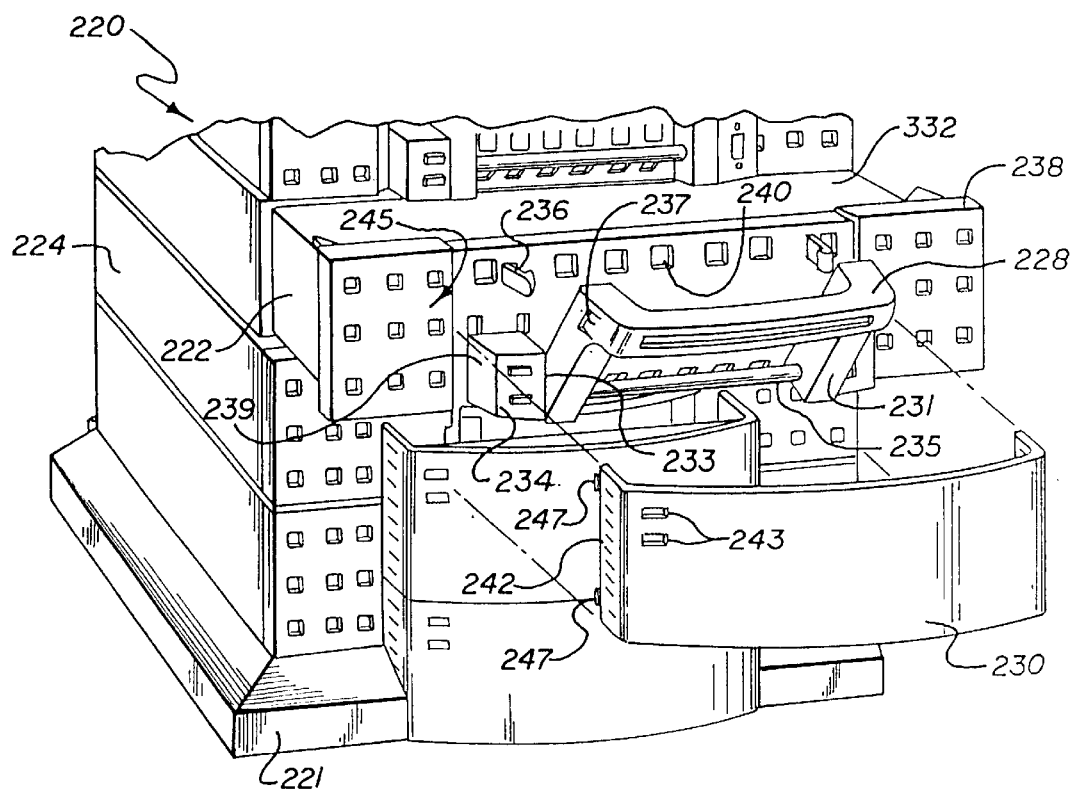
FIG. 15 is a front partial view of the array shown in FIG. 8 illustrating the features of the front cover plates.

FIG. 15 provides a detailed illustration of front cover plates 230 covering handle lever latches 228 on front bezels 238. Front cover plates 230 include outwardly extending front cover plate flanges 247 which are securable in front cover plate flange slots 245 in front bezels 238. Installation of front cover plates 230 to front bezels 238 is accomplished by manually deforming the sides of front cover plates 230 such that the front cover plate flanges 247 "snap" into front cover plate flange slots 245. Similarly, detaching front cover plates 230 from front bezels 238 is easily accomplished by deforming or pinching the side of front cover plates 230 inwardly thereby disengaging front cover plate flanges 247 from flange slots 245. Front cover vents 242 allow cooling air to pass through front cover plates 230 and into disk drive assemblies 222 through bezel vents 240. View ports 243 are included on front cover plates 230 allowing external viewing of activity indicators 234. Latch joint beam 235 extends between the lower ends of handle arms 231 providing a spring force sufficient to ensure that pivot arms 315, extending outwardly from the lower ends of handle arms 231, remain securely within bezel joint blocks 239 during normal operation.

A rear perspective view of an individual disk drive assembly housing 224 is provided in FIG. 16. The plurality of disk drive assembly housings 224 comprising disk array 220 are preferably coupled to one another by housing latching members 262 extending generally normal to the bottom of housing 224 being detachably secured in latching member securing port 248. Housing latching members 262 include latching member flanges 352 which, when inserted in latching member securing ports 248 engage securing port ledges 350 thereby coupling adjoining housings 224 in a "snap-together" manner. When it is desirable to remove housing 224 from array 220, sufficient horizontal pressure may be applied to flexible housing latching members 262 to disengage latching member flanges 352 from securing port ledges 350.

Other important features of the present invention are illustrated in FIG. 16. Shelf notches 316 into which upper forks 317 of handle arms 231 protrude, together with lower housing shelf 310 and leverage bar 312, are clearly depicted. Front coupling channel 256, shown as a cross-sectional view in FIG. 9a, includes a plurality of apertures into which front coupling lip 254 engages. Bottom power connector 344 is mounted vertically and oriented toward the bottom of housing 224 for automatically coupling with a top power connector 340 of a lower adjoining housing 224.

Figure 17:
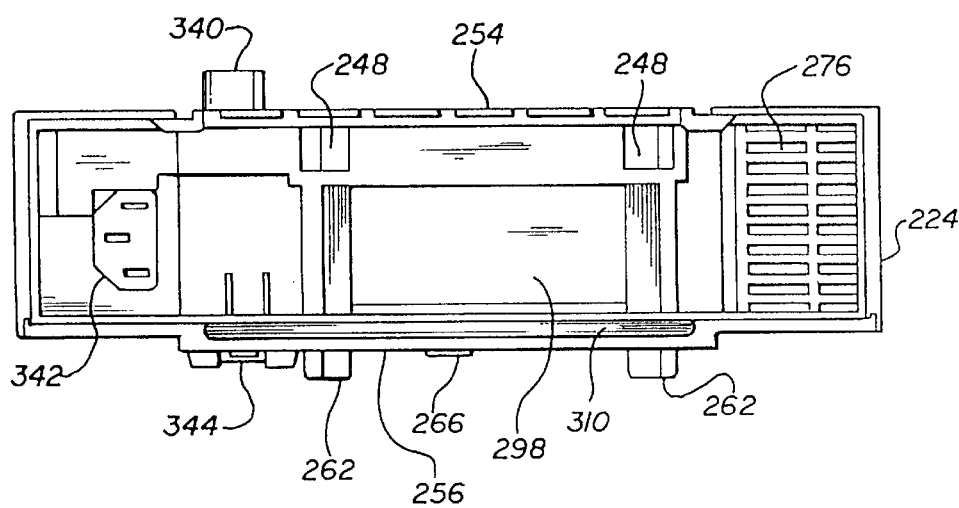
FIG. 17 is a front elevation view of one of the assembly housings illustrated in FIG. 8 with the separable disk drive assembly removed to show some of the visible features of the rear interior of the unit.

A front view of disk drive assembly housing 224 with inner disk drive assembly 222 removed is provided in FIG. 17. Of particular importance is the power connector 232 configuration which represents an important aspect of the present invention. More particularly, each housing power connector 232 is preferably comprised of a top power connector 340, an interior power connector 342, and a bottom power connector 344. Bottom power connector 344 is configured to automatically couple with top power connector 340 of a lower adjoining housing 224 or the power connector of optional disk drive array base 221. When another housing 224 is added to array 220, the bottom power connector 344 of the newly added housing 224 automatically connects with top power connector 340 of the previously uppermost housing 224. Thus, the inclusion of additional disk drive assembly housings 224 to array 220 expands the array power bus or backplane preferably in the manner described hereinabove.

Interior power connector 342 is configured to automatically connect with the power connector 324 of disk drive assembly 222 when disk drive assembly 222 is installed in housing 224. A ground connection between power connectors 324 and 342 is established prior to establishing power pin connectivity.

Another important feature of the present invention involves the automatic coupling of disk drive assembly 222 and housing 224 power and signal connectors. Actuation of handle level latch 228 firmly seats the mating housing 224 and disk drive assembly 222 power and signal connectors which remain firmly secured while handle level latch 228 remains in the locked position with handle latching fingers 236 releasably engaging handle latching grooves 237. Similarly, removing disk drive assembly 222 from housing 224 is accomplished by pulling on handle lever assembly 222 and housing 224 signal and power connectors. Thus, no manual signal or power connections need be made when disk drive assembly 222 is inserted or removed from its housing 224.

The Data Recovery or Parity Data Embodiment

Expanding upon the description of the present invention provided above, the vertically stacked data storage array of the present invention distributes data storage and parity data among several disk drives, as mentioned in the Summary of the Invention section of this specification and in the Boltman patent assigned to the assignee of this invention and cited in the Reference to Prior Applications section of this specification and in the earler parent specifications. With additional reference to FIGS. 19 and 20, exemplary embodiments of a vertically stackable disk array system according to the present invention are shown and provide data protection with reduced redundancy as the number of individual data storage units or disk drives increases. A host computer system represented by block 400 is in communication with a plurality of data storage units 402 which collectively form a disk array 404.

Figure 19:
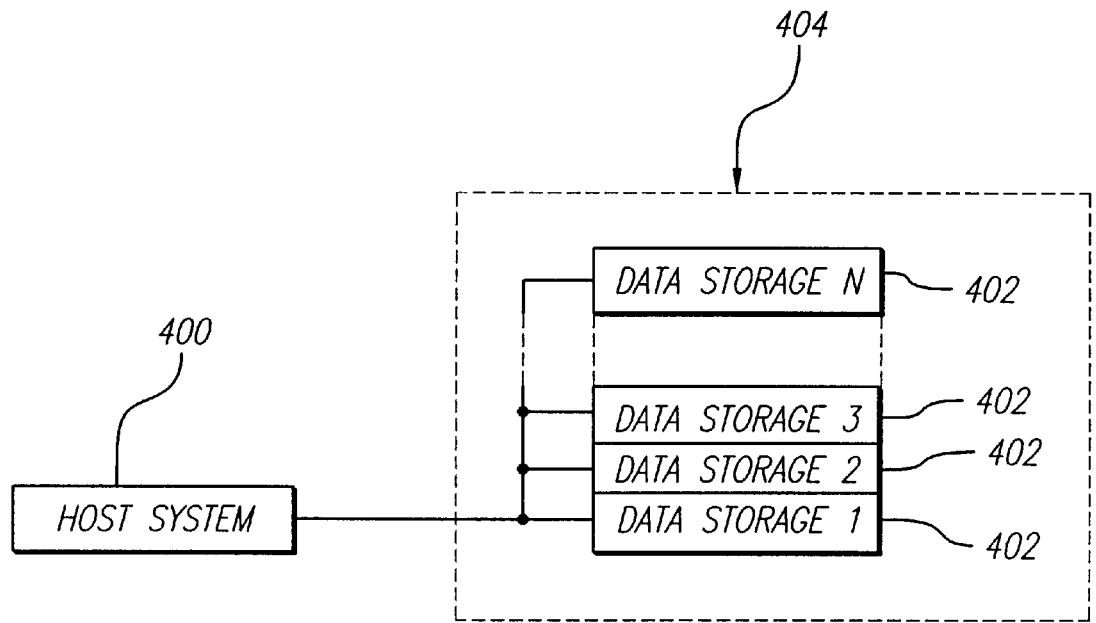
FIG. 19 is a block diagram of a data storage array connected to a host system illustrating data storage and back up data storage technology of the present invention.
Figure 20:
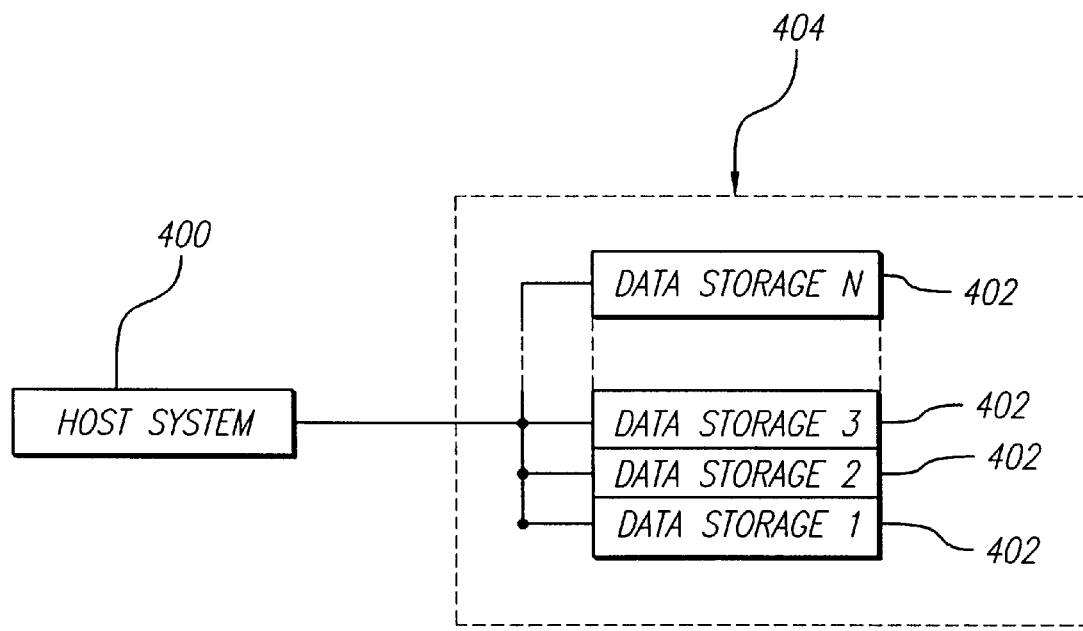
FIG. 20 is a block diagram similar to FIG. 19, illustrating an alternative connection scheme between a host system and a data storage array according to the present invention.

The host computer 400 may be a personal computer like that shown by computer 20 in FIGS. 1 and 3 or any other computer capable of functioning with plural data storage units 402. The host computer 400 is couplable to the storage units 402 by, for example, the communication card 24 and cable 26 as shown in FIG. 1 or other suitable connector or data bus device. The data storage units 404 may encompass a variety of data storage devices, for example, Winchester-type disk drives, optical storage devices, and so on, or any combination of such data storage devices. Each of the storage units 402 are preferably interconnected in parallel as described above with suitable signal connection means such as connector 38 in FIG. 3, for example. Accordingly, the host computer 400 may be connected to a single storage unit 402, as shown in FIG. 19 with the storage units 402 interconnected, or all of the units by a bus device as shown in FIG. 20. Further, the power connection means 36 described above may also be employed in these exemplary embodiments to provide power to the disk array 404.

The expandable, vertically stackable disk drive assemblies shown in FIGS. 19 and 20 eliminate the need to continuously back up data stored on the drives 402, through the use of parity technology. Parity-based data back-up technology often employs the basic algebraic postulate that states if A+B=C, then C−A=B and C−B=A. In many computer applications, this postulate is implemented as the exclusive-OR (XOR) Boolean operation. By way of background, exclusive-OR is the logic operation which yields a high output if only one of the inputs is high. This operation is also known as "odd parity." The exclusive-OR operation, for example, allows the computer system 400 to reconstruct data on a single drive 402 in the storage array 404 using data stored on the remaining or other drives 402.

For example, if there are three data storage units 402 in the array 404, two drives may be dedicated to data storage with the third drive dedicated to parity data storage. When writing new data to the drives 402, the host computer 400 may simultaneously modify data in both dedicated data storage drives 402 and generate new parity data from the new data, storing both the data and the new parity on their respective dedicated disk drives 402. However, as the disk drives 402 are independent, the host computer 400 is able to modify data in parallel. Therefore, it is preferable to distribute the parity data over any number or all of the data storage units 402 comprising the array 404. Each drive 402 in such an array stores a mixture of data and parity information, enabling the host computer 400 to issue read and write commands in parallel and to reconstruct unreadable stored data from other stored data and the parity data.

Although the present invention has been described in terms of the preferred embodiments above, numerous modifications and/or additions to the above-described preferred embodiments would be readily apparent to one skilled in the art.

For example, two, three or more discreet data storage devices may be housed within each housing or module. Also, in addition to the 5¼ and 3½ inch Winchester-type disk drives described above, 1.8 inch, 1 inch and other varieties of form factor disk drives may be used. Optical or worm drives may also be employed.

Turning to the cooling of the data storage devices, piezo-electric or semiconductor based cooling systems may be used instead of fans. The fans may be a/c or d/c powered. Also, the number of fans within the stack may be reduced and venting may be provided to allow air to flow between modules of the stack.

Fastening arrangements other than those described herein may be employed to couple adjoining disk drive assembly housings or modules. Alternative "snap-together" latching configurations, or housing geometries that couple without the need for fasteners or latching members, may be employed. Housing coupling alternatives not employing "snap-together" latching arrangements or fasteners may possess some or all of the novel features of the invention not being dependant on the "snap-together" coupling feature.

A modular array of disk drive assemblies being contained within non-separable stackable housings may be employed as a more economical alternative, with adjoining integral assembly housings, signal, and power connectors being coupled in a manner similar to, or different from, those described herein.

As described above, the array may either include or exclude a separate supporting base. Where the no separate base is provided, power and digital signal information are supplied directly to one of the drive assemblies.

As also described above, signal and power connection between adjoining housings may be accomplished by external or integral connections. Further, automatic power and signal coupling between the disk drive assemblies and their respective housings may be actuated by means other than the described handle lever latch. Rather than providing an installable integral housing signal connector, permanent integral signal connectors may be employed for automatically coupling the signal connectors of adjoining housings.

The number of data lines which are interconnected between adjacent storage device or a host computer system may be varied.

An active buffer or circuitry which will electrically isolate the stack may be provided.

Different switch assemblies may be employed. The number of indicator lamps may be increased or decreased. Liquid crystal displays may be used instead of light omitting diodes.

The data storage devices may be adapted for use with various types of data protocols.

It is intended that the scope of the present invention extends to all such modifications and/or additions and that the scope of the present invention is limited solely by the claims set forth below.

We claim:

1. An expandable modular data storage system for storing and backing up data from a host computer, the expandable modular data storage system comprising:

a plurality of disk drives, each disk drive defining a front side and including drive power connection means for providing power to the disk drive, drive signal connection means for providing signal input to and signal output from the disk drive, a cooling fan, air flow vents, a power indicator, and an activity indicator;

vertically stacked disk drive housings adapted to slidably receive a disk drive, each disk drive housing defining a top and a bottom;

latching means for releasably securing a disk drive within each of the disk drive housings;

mechanical connection means for releasably connecting the top of one disk drive housing to the bottom of another disk drive housing stacked thereon;

system power connection means for supplying power to the drive power connection means of each disk drive;

a first system signal connection means for connecting the drive signal connection means of a first set of said disk drives together to form a first data storage array; and a second system signal connection means for connecting the drive signal connection means of a second set of said disk drives together to form a second data storage array;

the drive signal connection means of said first and second sets of disk drives being connectable to respective first and second host computers for communicating data from the host computers to the disk drives, data from each host computer being storable on at least one disk drive and parity data for said data being storable on at least one disk drive, the parity data being a function of stored data, and stored data being reconstructable from the parity data and other stored data.

2. An expandable modular data storage array as claimed in claim 1, wherein parity data from the host computer are storable on each of the disk drives.

3. An expandable modular data storage array as claimed in claim 1, wherein parity data are storable on a disk drive different from the disk drive on which are stored data of which said parity data are a function.

4. An expandable modular data storage array as claimed in claim 1, wherein parity data are storable on a disk drive different from the disk drives on which are respectively stored different data of which said parity data are a function.

5. An expandable modular data storage array as claimed in claim 1, wherein said array includes data and parity distribution among the disk drives, permitting data recovery from the remaining disk drives if one disk drive fails.

6. An expandable modular data storage array for storing and backing up data from a host computer, the expandable modular data storage array comprising:

a first set of data storage devices, each of the data storage devices including a device power connector, data from a first host computer being storable on the data storage devices, parity data for the stored data being storable on at least one of the data storage devices;

a second set of data storage devices, each of the data storage devices including a device power connector, data from a second host computer being storable on the data storage devices, parity data for the stored data being storable on at least one of the data storage devices;

a plurality of substantially identical, vertically stacked storage device housings adapted to slidably receive a data storage device, each storage device housing defining a top and a bottom and including an interior power connector, a top power connector and a bottom power connector, the interior power connector being adapted to engage the device power connector of a data storage device received in a storage device housing and the top and bottom power connectors being located such that the top power connector of one storage device housing mates with the bottom power connector of another storage device housing stacked thereon; and at least one flexible latching member associated with at least one of the storage device housings, the flexible latching member engaging an adjacent storage device housing in response to the positioning of the at least one storage device housing in close proximity to the adjacent storage device housing.

7. An expandable modular data storage array as claimed in claim 6, wherein parity data from the host computer are storable on each of the data storage devices.

8. An expandable modular data storage array as claimed in claim 6, wherein said array includes data and parity distribution among the data storage devices, permitting data recovery from the remaining disk drives if one disk drive fails.

9. An expandable modular storage system comprising:

a host computer system;

a second computer system;

first and second sets of data storage devices, each of the data storage devices including an input power connector, an output power connector, an input signal connector and an output signal connector, the input signal connector of at least one data storage device of said first and second sets of data storage device being connectable to respective first and second host computer system, data transmitted from the first and second host computer systems being stored on respective data storage devices, parity data for stored data being stored on respective data storage devices, parity data being a function of stored data, and stored data being reconstructable from the parity data and other stored data;

a plurality of substantially identical, vertically stacked storage device housings adapted to slidably receive a data storage device, each storage device housing defining a top and a bottom and at least one hole formed in the top and bottom, the holes being located such that the top hole of one storage device housing is aligned with the bottom hole of another storage device housing stacked thereon;

mechanical fasteners associated with respective top and bottom hole pairs;

at least one power connector assembly for connecting the output power connector of one data storage device to the input power connector of another data storage device; and at least one signal connector assembly for connecting the output signal connector of one data storage device to the input signal connector of another data storage device.

10. An expandable modular data storage system as claimed in claim 9, wherein the host computer system stores parity data on a data storage device different from the data storage device on which are stored data of which said parity data are a function.

11. An expandable modular data storage array for storing and backing up data from a host computer, the expandable modular data storage array comprising:

a first set of data storage devices in communication with a first host computer, data from the first host computer being storable on the first set of data storage devices, parity data for stored data being storable on at least one of the data storage devices of said first set of data storage devices;

a second set of data storage devices in communication with a second host computer, data from the second host computer being storable on the second set of data storage devices, parity data for stored data being storable on at least one of the data storage devices of said second set of data storage devices;

a plurality of substantially identical, vertically stacked storage device housings adapted to slidably receive a data storage device, each storage device housing defining a top and a bottom; and mechanical connection means for releasably connecting the top of one storage device housing to the bottom of another storage device housing stacked thereon.

12. An expandable modular data storage array as claimed in claim 11, wherein each of the data storage devices includes a device signal connector, the device signal connectors of the data storage devices being connectable to the host computer, the storage array further comprising:

signal connection means for connecting the device signal connector of one data storage device to the device signal connector of another data storage device.

13. An expandable modular data storage array as claimed in claim 11, wherein the storage array includes data and parity distribution among the data storage devices, permitting data recover from the remaining data storage devices if one data storage device fails.

14. A method for storing and backing up data in data storage system, comprising the steps of:

connecting first and second host systems to respective first and second expandable modular data storage arrays comprising a plurality of vertically stacked data storage devices;

storing data transmitted from the first and second host systems on the data storage devices of the first and second storage array, respectively;

generating parity data as a function of stored data; and storing the parity data on at least one of the data storage devices.

15. A method as claimed in claim 14, wherein said connecting step comprises the step of:

connecting a host system to a vertically stacked expandable data storage array comprising a plurality of data storage devices, the host system being connected to one of the data storage devices.

16. A method as claimed in claim 15, further comprising the step of:

connecting the data storage devices in parallel;

whereby the host system is in communication with all of the data storage devices.

17. A method as claimed in claim 14, wherein said step of storing the parity data comprises the step of:

storing the parity data on any number of the data storage devices.

18. A method as claimed in claim 14, further comprising the step of:

reconstructing unreadable stored data from parity data which are a function of the unreadable data and from other stored data.

19. A method as claimed in claim 14, further comprising the step of:

distributing data and parity data among the data storage devices to permit data recovery from the remaining data storage devices if one of the data storage devices fails.

20. A method as claimed in claim 14, wherein said step of storing the parity data comprises the step of:

storing the parity data on a data storage device different from the data storage device on which are stored data of which the parity data are a function.

21. A method as claimed in claim 20, further comprising the steps of:

replacing one of the data storage devices with another data storage device; and reconstructing data which were stored on the replaced data storage device from parity data and stored data stored on the unreplaced data storage devices.

22. A method as claimed in claim 14 further comprising the step of:

vertically stacking an additional data storage device on top of the expandable modular data storage array.

23. A method as claimed in claim 22 further comprising the step of:

storing data transmitted from the host system on the additional data storage device.

24. A method as claimed in claim 22 wherein said vertically stacking step is repeated a plurality of times.

* * * * *